United States Patent
Morita

(10) Patent No.: US 7,906,370 B2
(45) Date of Patent: Mar. 15, 2011

(54) MOUNTING METHOD OF ELECTRONIC COMPONENTS, MANUFACTURING METHOD OF ELECTRONIC COMPONENT-EMBEDDED SUBSTRATE, AND ELECTRONIC COMPONENT-EMBEDDED SUBSTRATE

(75) Inventor: Takaaki Morita, Tokyo (JP)

(73) Assignee: TDK Corporation, Tokyo (JP)

( * ) Notice: Subject to any disclaimer, the term of this patent is extended or adjusted under 35 U.S.C. 154(b) by 245 days.

(21) Appl. No.: 11/987,262

(22) Filed: Nov. 28, 2007

(65) Prior Publication Data

US 2008/0211086 A1    Sep. 4, 2008

(30) Foreign Application Priority Data

Dec. 22, 2006    (JP) .................... 2006-346820

(51) Int. Cl.
- *H01L 21/44* (2006.01)
- *H01L 21/48* (2006.01)
- *H01L 21/50* (2006.01)

(52) U.S. Cl. ...................... 438/106; 438/108

(58) Field of Classification Search .......... 438/106–127, 438/E33.056

See application file for complete search history.

(56) References Cited

U.S. PATENT DOCUMENTS

| 7,190,064 B2 | 3/2007 | Wakabayashi et al. |
| 7,576,141 B2 * | 8/2009 | Katogi et al. ............... 522/162 |

FOREIGN PATENT DOCUMENTS

| JP | A-03-169029 | 7/1991 |
| JP | A 08-088316 | 4/1996 |
| JP | A-10-050930 | 2/1998 |
| JP | A-2002-305364 | 10/2002 |
| JP | A-2002-368026 | 12/2002 |
| JP | A-2003-298005 | 10/2003 |

* cited by examiner

*Primary Examiner* — Cuong Q Nguyen
(74) *Attorney, Agent, or Firm* — Oliff & Berridge, PLC

(57) ABSTRACT

There is disclosed a fixing method of an electronic component or the like in which when the electronic component and a resin layer are fixed, warp and bend of the electronic component can be inhibited. During manufacturing of a semiconductor-embedded substrate 200 in which a semiconductor device 220 is embedded, after the semiconductor device 220 is disposed on an unhardened resin layer 212, this device is stored in a container 31 of a pressurizing and heating unit 3, and the semiconductor device 220 is isotropically pressurized using an internal gas in the container 31 as a pressure medium, whereby the semiconductor device 220 is pressed to the unhardened resin layer 212, and the resin layer 212 is heated to harden. In consequence, the semiconductor device 220 is fixed and mounted on the resin layer 212 without being warped or bent.

7 Claims, 19 Drawing Sheets

MOUNTING METHOD OF ELECTRONIC COMPONENTS, MANUFACTURING METHOD OF ELECTRONIC COMPONENT-EMBEDDED SUBSTRATE, AND ELECTRONIC COMPONENT-EMBEDDED SUBSTRATE

BACKGROUND OF THE INVENTION

The present invention relates to a method for mounting electronic components on an insulating layer, an electronic component-embedded substrate, and a method for manufacturing the electronic component-embedded substrate.

In general, a substrate (an electronic component-embedded substrate) on which electronic components such as semiconductor devices (an IC and another semiconductor active device) are mounted has a structure in which the semiconductor devices (dies) having a bare chip state are fixed to the substrate including a single resin layer or a plurality of resin layers, and to meet demands for high performance and miniaturization of an electronic device, development of a module has been advanced on which active components such as the semiconductor devices and passive components such as resistances and capacitors are highly densely mounted.

In recent years, with regard to portable devices typified by a portable terminal such as a cellular phone, mounting with a density much higher than every before has earnestly been demanded, and these days, especially a demand for thinning has risen. On the other hand, also with regard to the electronic component-embedded substrate for use in such a portable device, higher densification and thinning are earnestly demanded, and further thinning of the electronic components themselves also rapidly advances.

In such manufacturing steps of the electronic component-embedded substrate, in general, after bonding and fixing a semiconductor device to an insulating layer such as the resin layer or an insulating base, land electrodes of the semiconductor device are connected to an internal wiring pattern in the electronic component-embedded substrate by wire bonding or flip chip connection. It is described in, for example, Japanese Patent Application Laid-Open No. 8-88316 that a semiconductor bare chip is bonded onto the substrate with an adhesive and that the semiconductor bare chip is connected to a wiring layer by wire bonding. A method is also known in which the semiconductor device is disposed on an unhardened resin layer, and the resin layer is hardened to fix both the device and the layer.

In addition, in a case where the semiconductor device is mounted on the substrate as described above, in order to firmly secure the semiconductor device to the insulating layer, the base or the like, the semiconductor device is tentatively set on the adhesive or the unhardened resin layer, and then pressed to come in close contact with the adhesive and the layer (pressed), and in this state, the adhesive and the resin layer need to be hardened. In this case, a method is used in which, for example, a ceramic-made grasping tool (e.g., a jig such as a collet for use in a die bonder unit) is usually attached to one surface of the semiconductor device to hold the semiconductor device by adsorption or the like, an opposite surface of the semiconductor device in this state is allowed to abut on the resin layer or the like and tentatively set, and further the pressure is applied to the semiconductor device with the grasping tool to attach and press the device to the resin layer or the like.

However, as described above, in recent years, the semiconductor device itself has become very thin (e.g., a several ten μm order). According to findings of the present inventor, it has been found that in a case where such a thin semiconductor device is physically pressed with a jig, even when it is intended to uniformly press the semiconductor device, a pressure is concentrated on a peripheral edge portion of the semiconductor device, and warp and bend tend to be unavoidably generated in the semiconductor device in which the resin layer or the like has been hardened. Moreover, in a case where, as described in Japanese Patent Application Laid-Open No. 8-88316, the surface of the semiconductor device on which any land electrode or bump is not formed is installed so as to face a resin layer side (a so-called face-up system), the surface on which the land electrodes and the bumps are formed needs to be grasped and pressed. Therefore, in a case where the semiconductor device is grasped and pressed so as to avoid the land electrodes and the bumps so that they are not damaged, the pressure to be applied to the semiconductor device is further locally and unevenly distributed, and the warp and the bend of the semiconductor device might become further conspicuous.

When the semiconductor device warps and bends in this manner, positions (especially positions in a height direction) of the land electrodes and the bumps deviate. Therefore, it might be difficult to securely connect the semiconductor device to the wiring layer, and deterioration of reliability of the electronic component-embedded substrate and deterioration of yield of a product might be caused. Moreover, in an electronic component-embedded substrate having a multilayered structure, multiple stages of resin layers and wiring layers are provided on the semiconductor device fixed to the substrate. Therefore, to securely connect these components, there is an increasingly strict restriction on an installing dimension of the semiconductor device, and a problem that the semiconductor device warps and bends is especially serious.

Moreover, when the semiconductor device is pressed onto the resin layer or the like, the device tends to warp and bend so that the peripheral edge portion of the device sinks in (caves in) the resin layer or the like. In this case, the resin in the vicinity of the peripheral edge portion of the semiconductor device easily rises at a peripheral wall of the device. According to the findings of the present inventor, a portion of the unhardened resin layer raised on the "side" of the semiconductor device in this manner easily becomes porous. In this case, a disadvantage occurs that even after the resin layer hardens, a fixing strength between the peripheral edge portion of the semiconductor device and the resin layer and a transverse strength of the substrate itself deteriorate, and a void portion of the resin layer easily absorbs humidity.

The above-mentioned situation similarly applies to electronic components other than the semiconductor device to be mounted on the substrate or the like.

SUMMARY OF THE INVENTION

The present invention has been developed in view of such a situation, and an object thereof is to provide a mounting method of electronic components in which when electronic components such as semiconductor devices and a resin layer are fixed, warp and bend of the electronic components can be suppressed, connection to a wiring layer can securely be retained, and deterioration of a securing strength of the electronic components can be inhibited, a manufacturing method of an electronic component-embedded substrate by use of the mounting method, and an electronic component-embedded substrate obtained by the manufacturing method.

To achieve the above object, a mounting method of electronic components according to the present invention is a method in which electronic components are fixed and mounted on an insulating layer, comprising: a disposing step of disposing the electronic components on an unhardened resin which is to form the insulating layer; a pressurizing step of isotropically pressurizing the electronic components via a pressure medium; and a heating step of heating and hardening the resin to form the insulating layer. It is to be noted that the "unhardened resin which is to form the insulating layer" in the present invention includes not only the whole resin to form the insulating layer but also an unhardened adhesive (paste, sheet or the like) for bonding and fixing the electronic components to a base such as a substrate.

In such a mounting method of the electronic components, first in the disposing step, the electronic components are disposed on the unhardened resin by appropriate means. Subsequently, in the pressurizing step, the electronic components are pressurized and pressed to the resin. At this time, since the electronic components are isotropically pressurized (so-called isotropic pressurizing) via the pressure medium, the pressure applied to the electronic components is prevented from being locally and unevenly distributed. Therefore, generation of such warp and bend that the peripheral edge portion of the electronic component sinks in the unhardened resin is inhibited. Then, the heating step is performed, whereby the resin softens, and further hardens to form the insulating layer, and the electronic components are fixed to the insulating layer in a state in which any warp or bend is not generated. In this case, the resin in the vicinity of the peripheral edge portion of the electronic component is inhibited from protruding and rising at the peripheral wall of the electronic component.

Furthermore, it is preferable that at least a part of the pressurizing step and at least a part of the heating step, preferably all of both the steps are simultaneously performed. In other words, it is preferable to perform hot isotropic pressurizing. In this case, a time required for fixing the electronic components to the insulating layer is reduced.

In this case, it is preferable that the pressurizing step is performed at least while the resin softens in the heating step, that is, from a time when the electronic components are disposed on the resin to a time when the resin hardens. In this case, even on conditions that the electronic components might sink in the resin owing to their weights to be deformed, the electronic components are isotropically pressurized during the step, and hence such deformation of the electronic components due to their weights is effectively prevented.

Furthermore, it is more preferable that the pressurizing step isotropically pressurizes the electronic components and the resin in at least peripheries of the electronic components. At this time, it is especially preferable to simultaneously perform the isotropic pressurizing of both the components and the resin. In this case, since the resin around the disposed electronic components is also pressed with a pressure equal to that for pressing the electronic components, protruding and rising of the resin from peripheral edge portions of the electronic components are more effectively prevented.

In addition, it is more preferable that the pressurizing step uses, as the pressure medium, a gas or a liquid (including a liquid-like body) which is disposed so as to cover the electronic components and the periphery of the resin, because the electronic components can securely and isotropically be pressurized. Specifically, for example, a method may be used in which the unhardened resin on which the electronic components have been disposed is introduced in a pressurizing container where the gas (an atmospheric gas) or the liquid is stored, and the inside of the container is pressurized. In this case, the gas or the liquid in the container is heated with an appropriate temperature gradient, whereby heat is applied to the resin via the gas or the liquid, so that the pressurizing step and the heating step can simultaneously be performed with respect to the electronic components and the resin.

Alternatively, it is preferable that the pressurizing step uses, as the pressure medium, a film body or an elastic body which is arranged at least so as to cover bare surfaces of the electronic components and so as to come in close contact with the bare surfaces, and pressurizing means for applying a pressure to the film body or the elastic body, because the electronic components can sufficiently isotropically be pressurized.

Specifically, for example, a method may be used in which the whole upper portions of the electronic components disposed on the unhardened resin are covered with a film (e.g., a thin film made of a resin or a rubber) having a stretching property and flexibility, and further the pressure is applied to the film via the pressure medium including a fluid such as the gas or the liquid. In other words, a method may be used in which the electronic components and the film are attached (laminated) and isotropically pressurized. In consequence, the pressurizing step can simultaneously be performed with respect to the electronic components and the resin.

Moreover, a method may be used in which air is discharged from a space between the film and the electronic components, a pressure in the space is reduced to closely seal the electronic components with the film (so-called vacuum laminating is performed), and the electronic components are isotropically pressurized from the outside of the film via the film by an atmospheric pressure. In this case, the electronic components and the whole unhardened resin may be stored in a bag-like film, a pressure in the film may be reduced to closely seal the electronic components and the whole resin with the film, and the electronic components and the whole resin may isotropically be pressurized from the outside of the film via the film by the atmospheric pressure. Even in this case, the pressurizing step can simultaneously be performed with respect to the electronic components and the resin.

Furthermore, a manufacturing method of an electronic component-embedded substrate according to the present invention comprises a semiconductor fixing step which executes the mounting method of the electronic components according to the present invention, an insulating layer forming step of forming a further insulating layer on the fixed electronic components, and a wiring layer forming step of forming a wiring layer to be electrically connected to the electronic components on the further insulating layer.

In addition, when such a manufacturing method is performed, it is possible to effectively manufacture an electronic component-embedded substrate according to the present invention such as an electronic component-embedded substrate wherein in a direction vertical to the surface of the electronic component, a level difference between the center and a peripheral end portion of the electronic component is 10% or less of a thickness of the insulating layer under the center of the electronic component, an electronic component-embedded substrate wherein a portion of the insulating layer in the vicinity of a peripheral wall of the electronic component is non-porous, or an electronic component-embedded substrate wherein a portion of the insulating layer under the electronic component is non-foaming.

According to the present invention, since the electronic components disposed on the unhardened resin are isotropically pressurized via the pressure medium, uneven distribution of a pressure to be applied to the electronic component is prevented, and generation of such warp and bend that a peripheral edge portion of the electronic component sinks in an unhardened resin can be inhibited. Therefore, connection with the wiring layer can securely be retained, so that rising of the resin due to the sinking of the peripheral edge portion of the electronic component is inhibited, so that deterioration of a securing strength between the electronic component and the insulating layer can be inhibited.

DESCRIPTION OF THE PREFERRED EMBODIMENT

Figure 1:
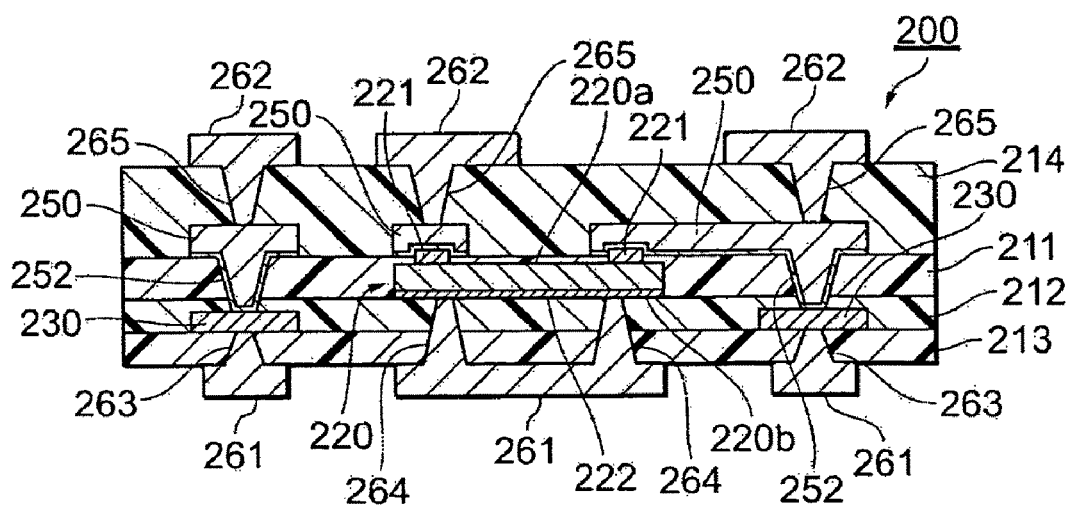
FIG. 1 is a sectional view showing a main part of one example of an electronic component-embedded substrate manufactured by a manufacturing method of the electronic component-embedded substrate according to the present invention.

An embodiment of the present invention will hereinafter be described in detail. It is to be noted that the same element is denoted with the same reference numeral, and redundant description is omitted. Moreover, it is assumed that vertical and horizontal positional relations and the like are based on a positional relation shown in the drawing, unless it is especially otherwise mentioned. Furthermore, a dimensional ratio of the drawing is not limited to a shown ratio. The following embodiment merely illustrates the present invention, and it is not intended that the present invention is limited to the embodiment only. In addition, the present invention can variously be modified without departing from the scope.

FIG. 1 is a sectional view showing a main part of one example of an electronic component-embedded substrate manufactured by a manufacturing method of the electronic component-embedded substrate according to the present invention.

In a semiconductor-embedded substrate 200 (an electronic component-embedded substrate), a semiconductor device 220 which is an electronic components such as a semiconductor IC (die) in a bare chip state is buried in a resin layer 211 among laminated resin layers 211 to 214. The substrate includes alignment marks 230 formed in the resin layer 212 (an insulating layer) as an underlayer of the device, various wiring patterns 250, 261 and 262 including conductors electrically connected to the semiconductor devices 220, and through electrodes 252, 263 to 265 connected to these wiring patterns.

Figure 21:
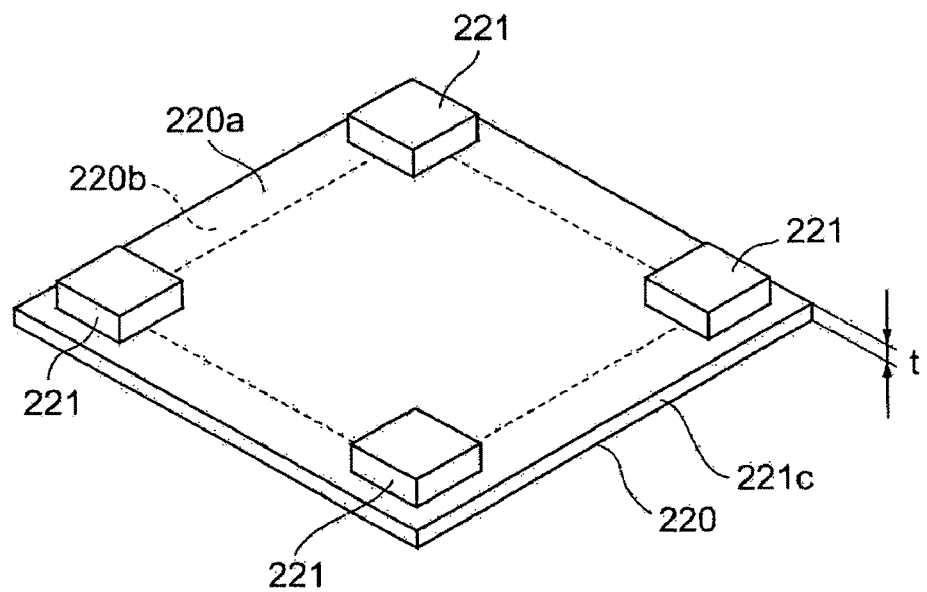
FIG. 21 is a perspective view showing a schematic structure of a semiconductor device 220.

Here, FIG. 21 is a perspective view showing a schematic structure of the semiconductor device 220. The semiconductor device 220 has a large number of land electrodes (not shown) and bumps 221 at a substantially rectangular plate-like main surface 220a of the device. It is to be noted that in the drawing, the bumps 221 are shown at only four corners, and the other bumps 221 are omitted. There is not any special restriction on a type of the semiconductor device 220, but an efficient heat release countermeasure against heat generated in the semiconductor device 220 is performed as described later, and hence a digital IC having a very high operation frequency or the like, for example, CPU or DSP is preferably usable.

Furthermore, there is not any restriction, but a back surface 220b of the semiconductor device 220 is polished, whereby a thickness t (a distance from the main surface 220a to the back surface 220b) of the semiconductor device 220 is set to be smaller than that of a usual semiconductor device, and is set to, for example, preferably 200 μm or less, more preferably about 20 to 50 μm. On the other hand, to further thin the semiconductor device 220, it is preferable that the back surface 220b is subjected to a surface roughing treatment such as etching, plasma treatment, laser irradiation, blast polishing, buff polishing or chemical treatment.

It is to be noted that it is preferable to collectively polish the back surfaces 220b of the semiconductor devices 220 with respect to a large number of semiconductor devices 220 in a wafer state and to afterward divide a wafer into the individual semiconductor devices 220 by dicing. In a case where the wafer is cut and separated into the individual semiconductor devices 220 by dicing before thinning the devices by polishing, the back surface 220b may be polished in a state in which the main surface 220a of the semiconductor device 220 is covered with a resin or the like.

Moreover, each of the bumps 221 is one type of conductive protrusion, and there is not any special restriction on a type of the bump, but examples of the bump include various bumps such as a stud bump, a plate bump, a metal plating bump and a ball bump. It is to be noted that the plate bumps are shown in the drawing.

When the stud bump is used as the bump 221, a bump of gold (Au) or copper (Cu) may be formed by wire bonding. When the plate bump is used, the bump may be formed by plating, sputtering or evaporation. When the metal plating bump is used, the bump may be formed by metal plating. When the ball bump is used, the bump may be formed by disposing a solder ball on a land electrode 221a, and then melting this ball, or by printing a cream solder on the land electrode, and then melting this solder. Alternatively, there may be used a conical or columnar bump formed by screen-printing a conductive material and hardening this material, or a bump formed by printing a nano-paste and heating the paste to sinter the paste.

There is not any special restriction on a metal type usable in the bump 221, but examples of the metal type include gold (Au), silver (Ag), copper (Cu), nickel (Ni), tin (Sn), chromium (Cr), an alloy of nickel and chromium and a solder, and it is preferable to use copper among these metals. When copper is used as a material of the bump 221, as compared with a case where gold is used, a high bonding strength with respect to the land electrode 221a can be obtained, and reliability of the semiconductor device 220 is improved.

Moreover, a dimensional shape of the bump 221 can appropriately be set based on an interval (a pitch) between the land electrodes 221a. When the pitch between the land electrodes 221a is, for example, 100 μm, a maximum diameter of the bump 221 may be set to about 10 to 90 μm, and a height may be set to about 2 to 100 μm. It is to be noted that after the wafer is cut and separated into the individual semiconductor devices 220 by the dicing, the bumps 221 may be bonded to the respective land electrodes 221a by use of a wire bonder.

As shown in FIG. 1, in the semiconductor device 220 according to the present embodiment, the main surface 220a of the semiconductor device 220 is directly covered with the resin layer 211, and the back surface 220b of the semiconductor device 220 is directly covered with the resin layer 212. The bumps 221 of the semiconductor device 220 are provided so as to protrude from the surface of the resin layer 211, and these protruding portions are connected to the wiring patterns 250 formed on the resin layer 214.

Moreover, a metal layer 222 is formed on the back surface 220b of the semiconductor device 220. This metal layer 222 functions as a heat release path of heat generated in a case where the semiconductor device 220 operates, further effectively prevents cracks which might be generated in the back surface 220b of the semiconductor device 220 owing to heat stress or the like, and performs a role to improve a handling property of the semiconductor device 220, although it is increasingly difficult to handle the device because the device is thinned.

The metal layer 222 is connected to the wiring pattern 261 formed on the outermost layer via the through electrode 264 formed so as to extend through the resin layers 212, 213. This through electrode 264 is a release path of the heat generated in the semiconductor device 220, and the heat is efficiently released to a base such as a mother board through these components.

Here, specific examples of a material for use in the resin layers 211 to 214 include a vinyl benzyl resin; a polyvinyl benzyl ether compound resin; a bismaleymidtriazine resin (a BT resin); a polyphenylether (polyphenylene ether oxide) resin (PPE, PPO); a cyanate ester resin; an epoxy+active ester hardened resin; a polyphenylene ether resin (a polyphenylene oxide resin); a hardening polyolefin resin; a benzocyclobutene resin; a polyimide resin; an aromatic polyester resin; an aromatic liquid crystal polyester resin, a polyphenylene sulfide resin; a polyether imide resin; a polyacrylate resin; a polyether ether ketone resin; a fluorine resin; an epoxy resin; a single body of a phenol resin or a benzoxazin resin; a material in which, to one of the resins, silica, talc, calcium carbonate, magnesium carbonate, aluminum hydroxide, magnesium hydroxide, aluminum borate whisker, potassium titanate fiber, alumina, glass flake, glass fiber, tantalum nitride, aluminum nitride or the like is added; a material in which, to one of these resins, there is added metal oxide powder including at least one of metals such as magnesium, silicon, titanium, zinc, calcium, strontium, zirconium, tin, neodymium, samarium, aluminum, bismuth, lead, lanthanum, lithium and tantalum; a material in which one of these resins is blended with a resin fiber such as glass fiber or aramid fiber; and a material in which one of these resins is impregnated into glass cloth, aramid fiber, non-woven cloth or the like. The material can appropriately be selected and used from a viewpoint of an electric characteristic, a mechanical characteristic, water absorption, resistance to reflow or the like.

Next, one example of a manufacturing method of the semiconductor-embedded substrate 200 will be described with reference to the drawings. FIGS. 2 to 17 are step diagrams showing one example of a procedure of manufacturing the semiconductor-embedded substrate 200 shown in FIG. 1.

Figure 2:
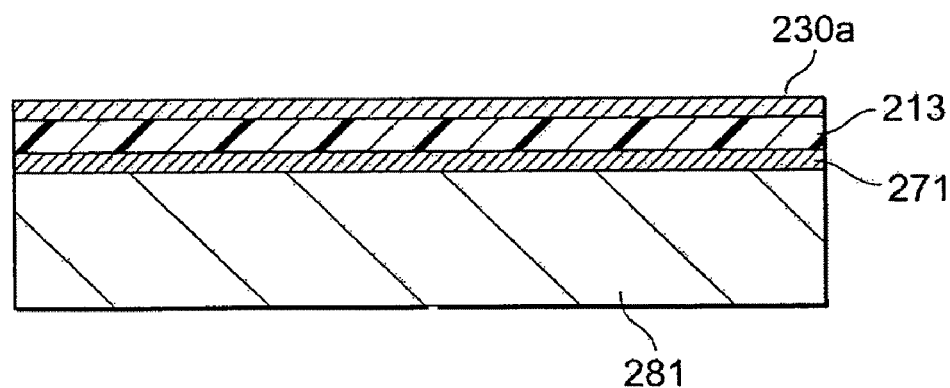
FIG. 2 is a step diagram showing one example of a procedure to manufacture a semiconductor-embedded substrate 200.
Figure 3:
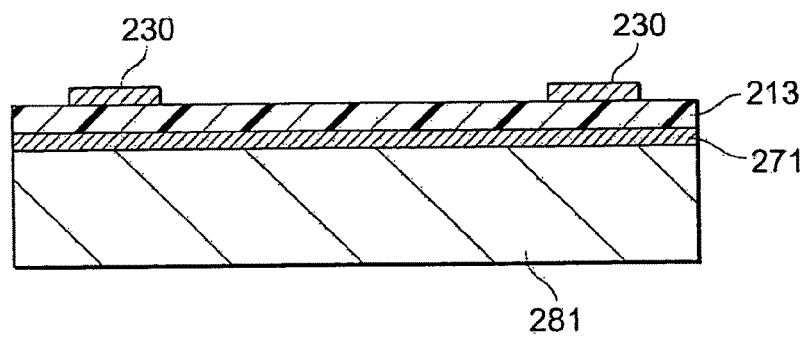
FIG. 3 is a step diagram showing one example of the procedure to manufacture the semiconductor-embedded substrate 200.

First, the flat plate-like resin layer 213 provided with conductive layers 230a, 271 formed on both surfaces thereof is prepared, and a support substrate 281 is attached to one surface (a conductive layer 271 side) (FIG. 2). Subsequently, the conductive layer 230a is patterned to thereby form the alignment marks 230 (FIG. 3). The alignment marks 230 may be used as a wiring pattern in the semiconductor-embedded substrate 200.

Figure 4:
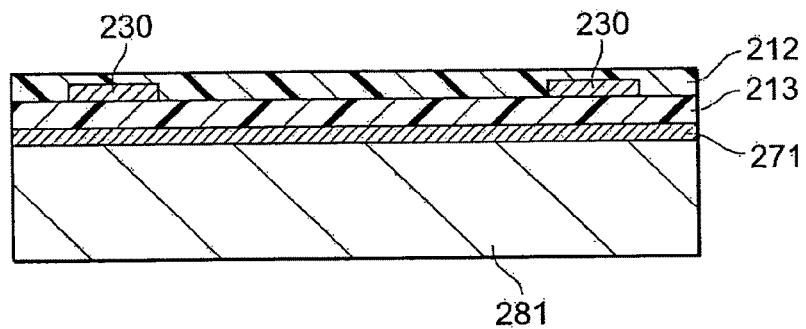
FIG. 4 is a step diagram showing one example of the procedure to manufacture the semiconductor-embedded substrate 200.
Figure 5:
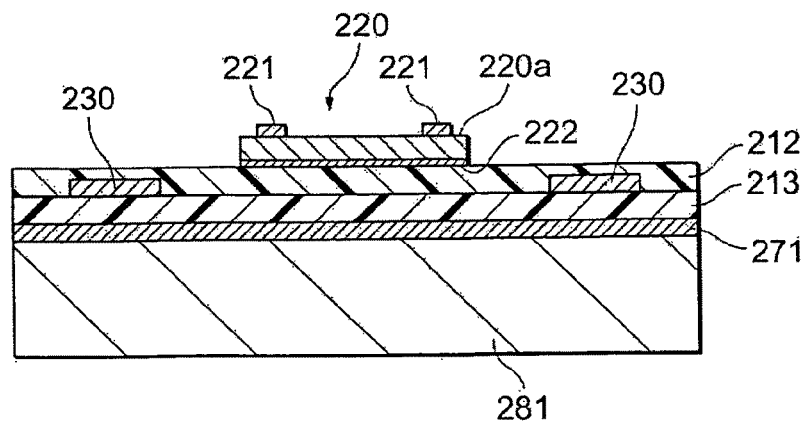
FIG. 5 is a step diagram showing one example of the procedure to manufacture the semiconductor-embedded substrate 200.

Subsequently, the resin layer 213 is coated with an unhardened resin for forming the resin layer 212 by an appropriate technique, and the unhardened resin layer 212 is formed so as to cover the alignment marks 230 (FIG. 4). Furthermore, while alignment is performed using the alignment marks 230, the semiconductor device 220 held with a grasping tool such as a collet (not shown) is disposed and tentatively set on the unhardened resin layer 212 (FIG. 5; a disposing step). In the present embodiment, the semiconductor device 220 is mounted on the resin layer 212 by a face-up system, that is, so as to dispose the main surface 220a upwards. In consequence, the back surface 220b of the semiconductor device 220 abuts on the resin layer 212, and is completely covered.

Figure 6:
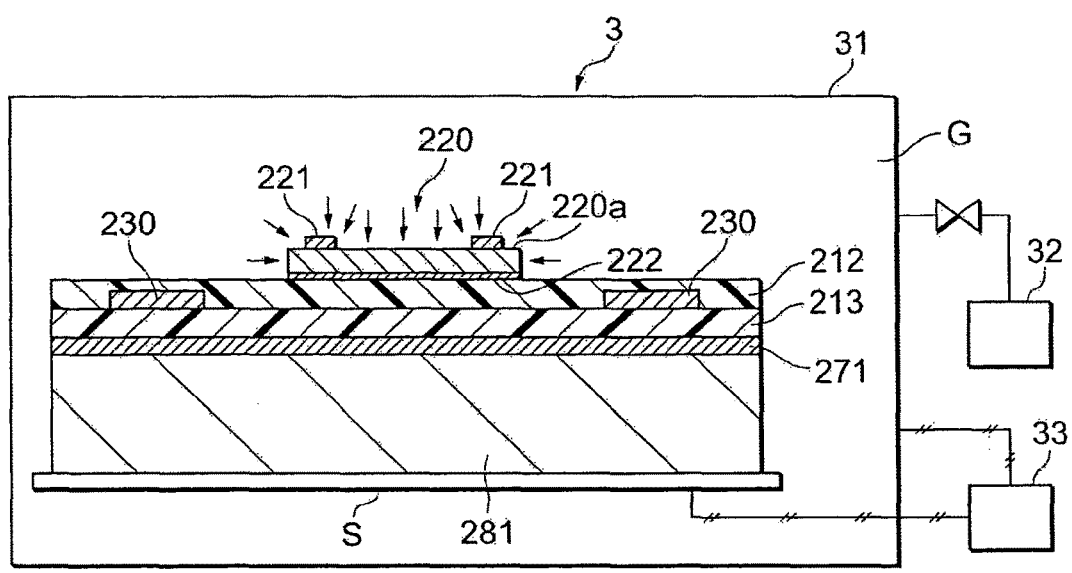
FIG. 6 is a step diagram showing one example of the procedure to manufacture the semiconductor-embedded substrate 200.
Figure 7:
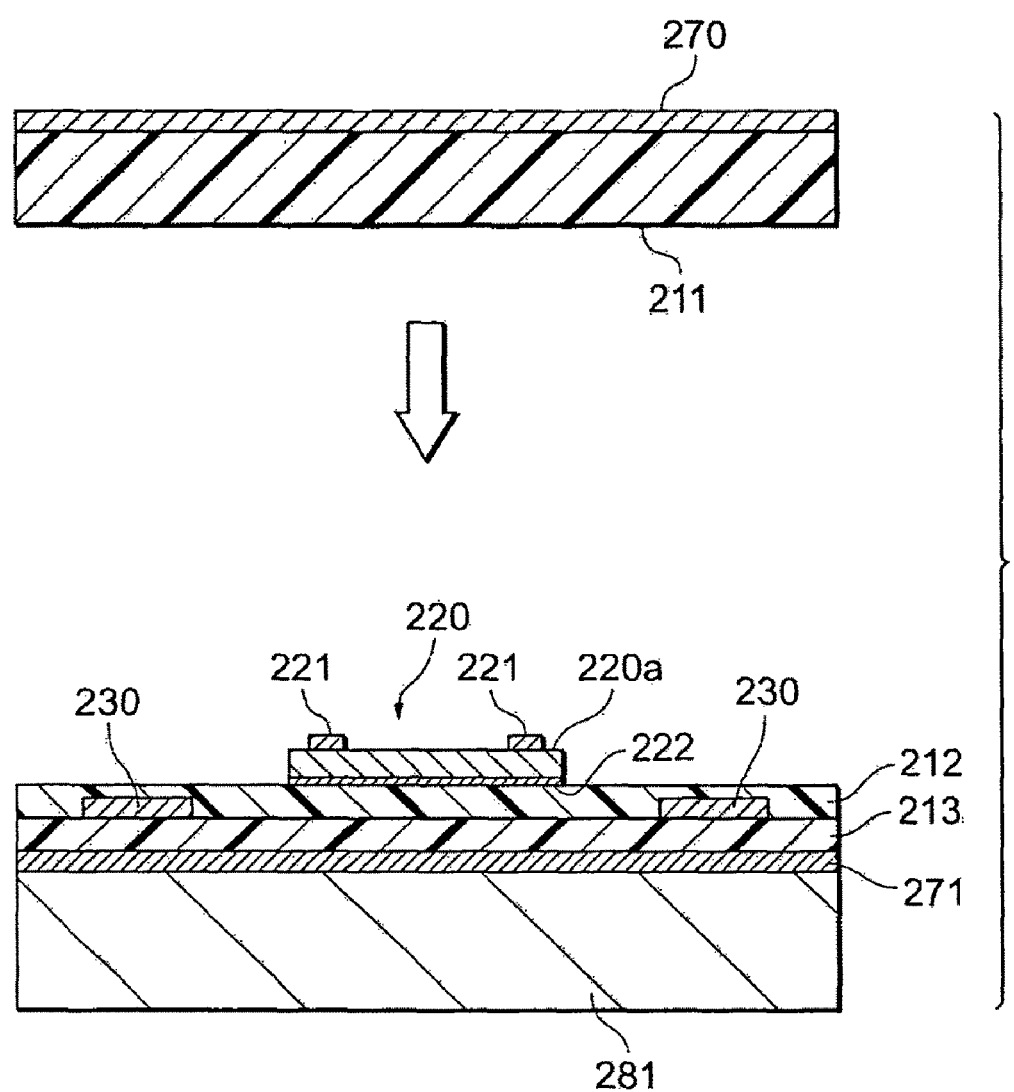
FIG. 7 is a step diagram showing one example of the procedure to manufacture the semiconductor-embedded substrate 200.

Subsequently, this semiconductor device 220 once tentatively set on the unhardened resin layer 212 is stored in the container 31 of the pressurizing and heating unit 3, and left to stand still on a support base S (FIG. 6). The pressurizing and heating unit 3 is stored in the container 31 connected to a pressurizing machine 32 having a compression unit such as a compressor and a heating machine 33 such as an electric heater, and can be pressurized and heated using an internal gas G of the container 31 as a medium.

Then, the gas compressed using the pressurizing machine 32 is injected into a unit tank to pressurize the internal gas G, whereby the semiconductor device 220 is isotropically pressurized, and the back surface 220b of the semiconductor device 220 is pressed to the resin layer 212 (a pressurizing step). During the pressurizing, the heating machine 33 is operated to heat an internal atmosphere of the container 31 (including the support base S as the case may be), whereby the resin layer 212 is once softened to such an extent that bonding is conveniently performed, and then further thermally hardened (a heating step). The isotropic pressurizing step and the heating step are simultaneously performed in this manner, whereby both the semiconductor device 220 and the resin layer 212 are subjected to so-called hot isotropic pressurizing, and the semiconductor device 220 is brought into close contact with the resin layer 212 to fix the device to the layer. The disposing step shown in FIG. 5, and the pressurizing step and the heating step shown in FIG. 6 constitute a semiconductor fixing step which executes a mounting method of electronic components according to the present invention. It is to be noted that a plurality of arrows in FIG. 6 schematically indicate that the semiconductor device 220 is isotropically pressurized. At this time, the resin layer 212 around the semiconductor device 220 is simultaneously and isotropically pressurized with an equal pressure, but arrows indicating this state are omitted from the drawing. This also applies to FIGS. 18 to 20 described later.

Here, pressurizing conditions and heating conditions in the pressurizing and heating unit 3 can appropriately be selected in accordance with a type and a property of the resin layer 212, a type and a dimensional shape of the semiconductor device 220, a capacity and a characteristic of the pressurizing and heating unit 3 and the like, and there is not any special restriction on the pressurizing and heating conditions. However, for example, the unhardened resin layer 212 on which the semiconductor device 220 has been disposed is stored beforehand in the container 31 at room temperature or at a temperature raised to a certain degree, and a pressure is raised from the atmospheric pressure to 0.5 MPa with an appropriate pressure gradient. In a state in which the pressure is retained, the temperature is raised to a melting point of the resin of the resin layer 212 or so (e.g., 60° C. to 100° C.) with an appropriate temperature gradient, and the semiconductor device 220 is completely brought into close contact with the unhardened resin layer 212. Afterward, while the pressurized state is retained, the temperature is again raised to a hardening start temperature of the resin layer 212 as a thermosetting resin or more (e.g., 130° C. to 180° C.). After the temperature is retained for an appropriate time (e.g., several minutes to several ten minutes) until the resin layer 212 hardens, the temperature and the pressure are lowered to a predetermined temperature such as room temperature and a predetermined pressure such as the atmospheric pressure with appropriate temperature and pressure gradients, respectively.

Figure 8:
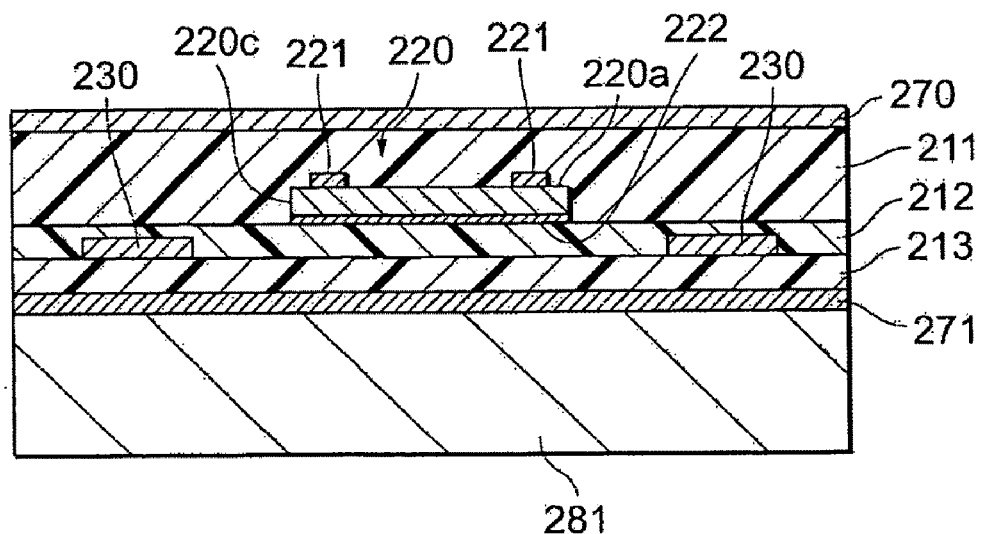
FIG. 8 is a step diagram showing one example of the procedure to manufacture the semiconductor-embedded substrate 200.

Subsequently, the semiconductor device 220 fixed and mounted on the resin layer 212 is taken out of the pressurizing and heating unit 3, a laminated sheet constituted of the resin layer 211 and a resin layer 270 is superimposed so that the resin layer 211 faces the main surface 220a of the semiconductor device 220 (FIG. 7), and both the device and the sheet are pressed while heated. In consequence, it is assumed that the main surface 220a and side surface 220c of the semiconductor device 220 are covered with the resin layer 211 (FIG. 8; an insulating layer forming step). That is, at this point, the semiconductor device 220 is buried in the resin layer 211, and nipped between the resin layers 211 and 212.

Figure 9:
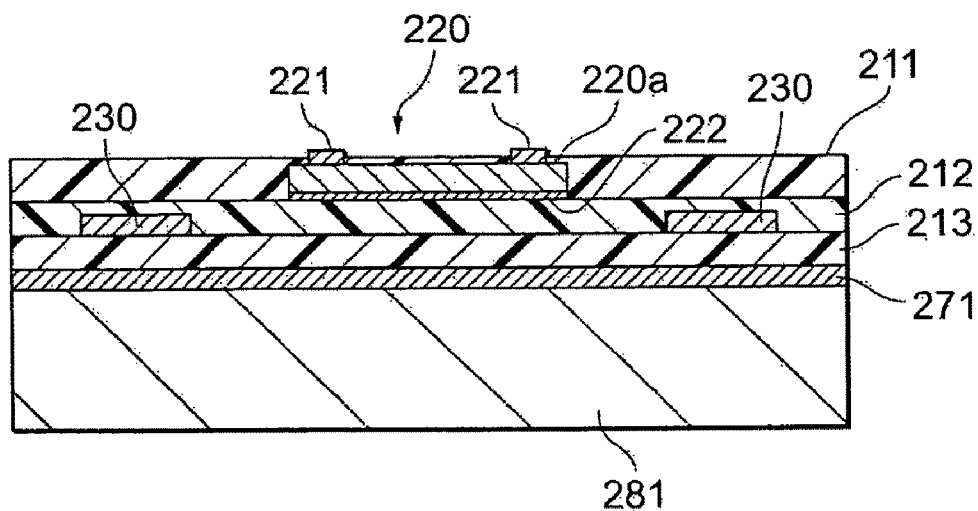
FIG. 9 is a step diagram showing one example of the procedure to manufacture the semiconductor-embedded substrate 200.

Then, after the resin layer 270 is removed, a surface layer of the resin layer 211 is etched by a wet blast process or the like, and in this case, an amount to be etched and etching conditions are appropriately regulated so that the bumps 221 provided on a main surface 220a side of the semiconductor device 220 are protruded from the surface of the resin layer 211 (FIG. 9).

Figure 10:
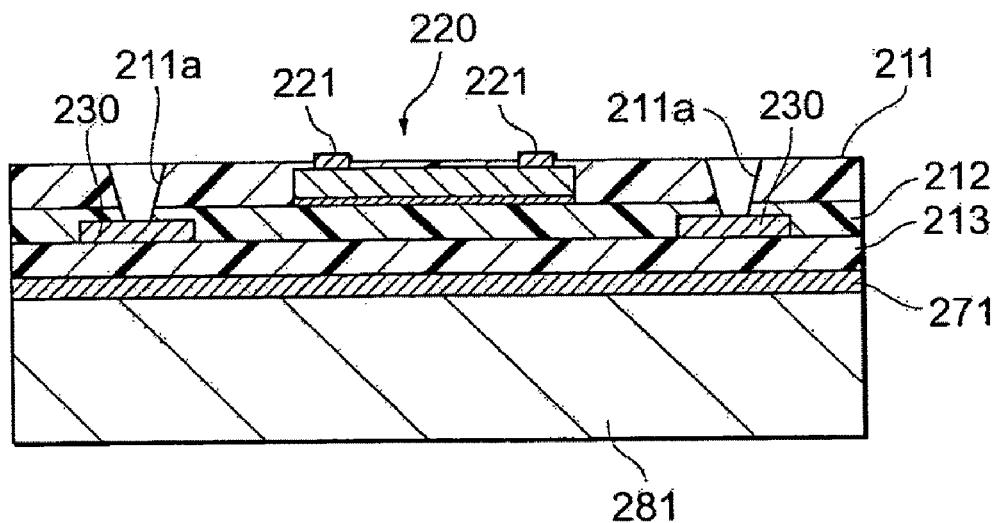
FIG. 10 is a step diagram showing one example of the procedure to manufacture the semiconductor-embedded substrate 200.

Subsequently, through holes 211a are formed so as to pass through the resin layers 211, 212 and reach the alignment marks 230 (FIG. 10). There is not any special restriction on a method for forming these through holes 211a, but examples of the method include a method of laser abrasion to directly irradiate the resin layer 211 with laser and a method for blasting such as sand blasting. In the latter case where the blasting is performed, a metal film such as a copper film is formed on the resin layer 211, and subjected to conformal processing by use of photolithography and etching, whereby a mask pattern having openings at positions to open the through holes 211a is formed, and then a blast treatment is performed using the metal film as a mask.

Figure 11:
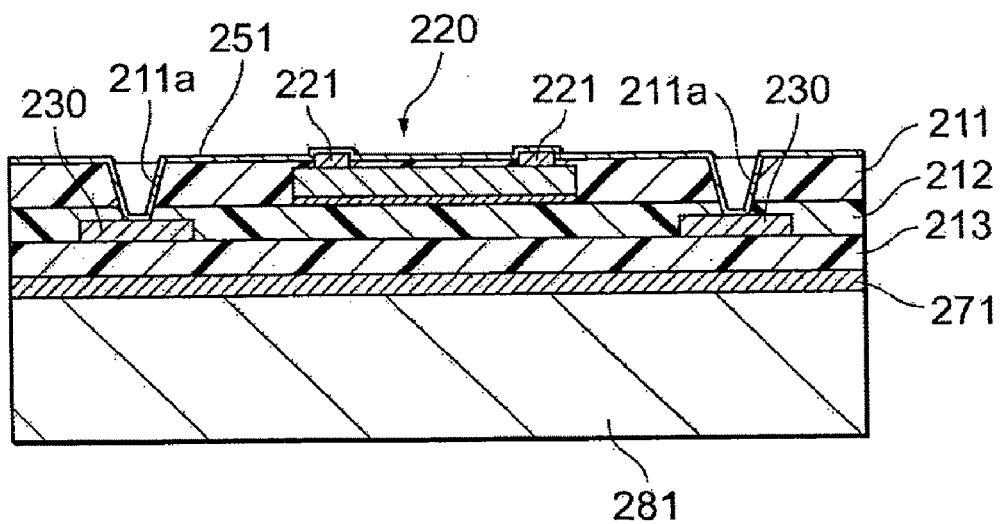
FIG. 11 is a step diagram showing one example of the procedure to manufacture the semiconductor-embedded substrate 200.

Subsequently, a thin conductive underlayer 251 is formed on the whole surface of the resin layer 211 including inner surfaces of the through holes 211a by a gas phase growth process such as a sputtering process. In consequence, portions of the alignment marks 230 exposed at bottom portions of the through holes 211a and protruding portions of the bumps 221 are covered with the conductive underlayer 251 (FIG. 11). It is to be noted that during the above-mentioned wet blast treatment of the resin layer 211, the bumps 221 are protruded from the surface of the resin layer 211, and hence a pretreatment such as removal of etching residuals does not have to be necessarily performed before forming the conductive underlayer 251, but the pretreatment may be performed if necessary.

Figure 12:
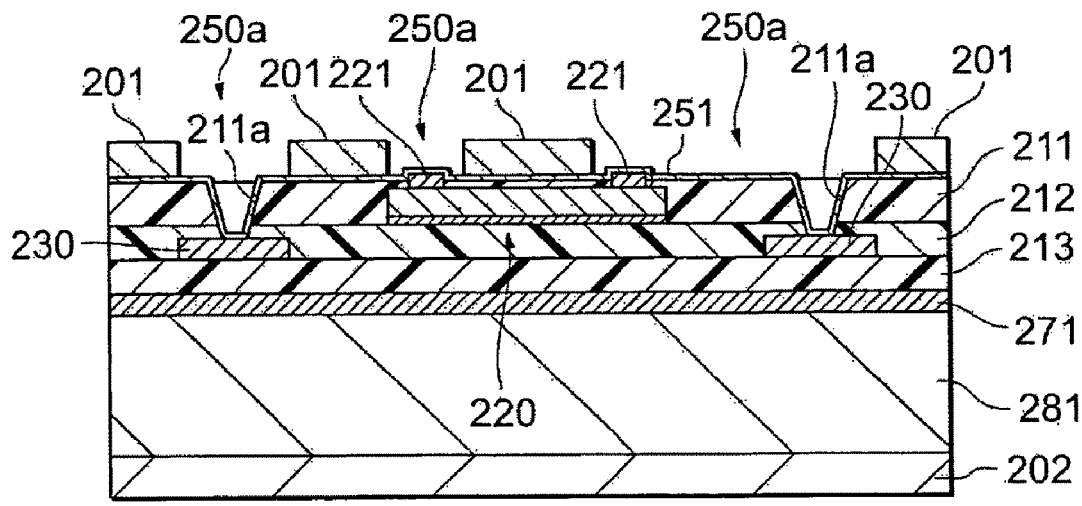
FIG. 12 is a step diagram showing one example of the procedure to manufacture the semiconductor-embedded substrate 200.

Subsequently, after photosensitive dry films 201, 202 are attached to both surfaces of a base, that is, an upper surface of the conductive underlayer 251 as shown and a lower surface of the support substrate 281 as shown, respectively, the dry film 201 is exposed using a photo mask (not shown), and the dry film 201 is removed from areas 250a where the wiring patterns 250 are to be formed. In consequence, in the areas 250a where the wiring patterns 250 are to be formed, the conductive underlayer 251 is exposed (FIG. 12). At this time, without removing the dry film 202, a state in which the whole surface of the support substrate 281 is covered is retained.

Figure 13:
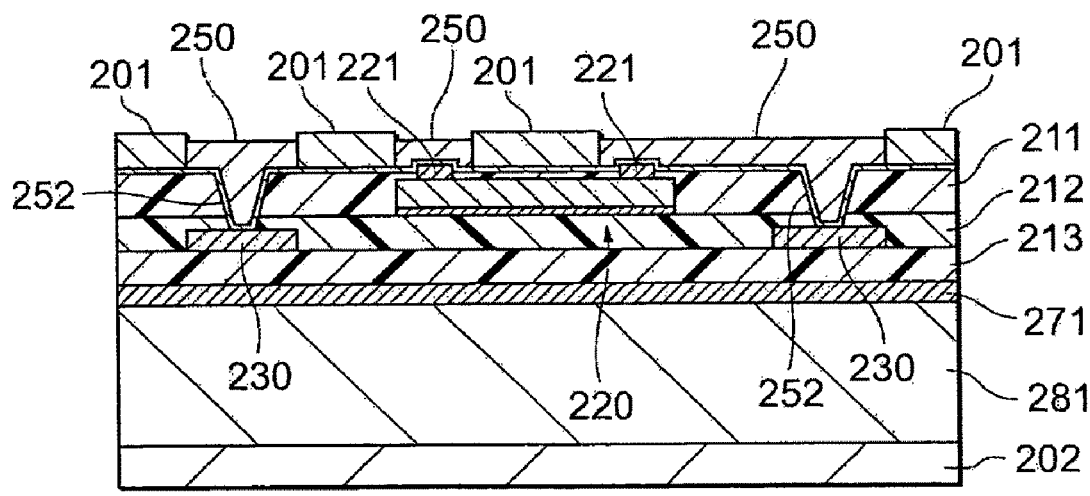
FIG. 13 is a step diagram showing one example of the procedure to manufacture the semiconductor-embedded substrate 200.

After a part of the conductive underlayer 251 is exposed in this manner, electrolytic plating is performed using the conductive underlayer 251 as a base, whereby the wiring patterns 250 are formed at the areas 250a in which the conductive underlayer 251 is exposed, and the through electrodes 252 are formed so as to fill in the through holes 211a (FIG. 13; a wiring layer forming step). In consequence, the through electrodes 252 are formed so as to extend through the resin layers 211, 212, and the alignment marks 230 are connected to the wiring patterns 250 via the through electrodes 252. At this time, since the whole surface of the support substrate 281 is covered with the dry film 202, any conductive layer is not formed by plating.

Figure 14:
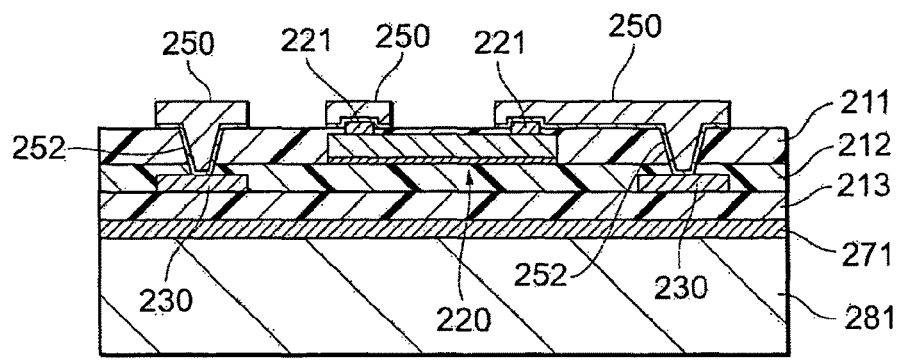
FIG. 14 is a step diagram showing one example of the procedure to manufacture the semiconductor-embedded substrate 200.
Figure 15:
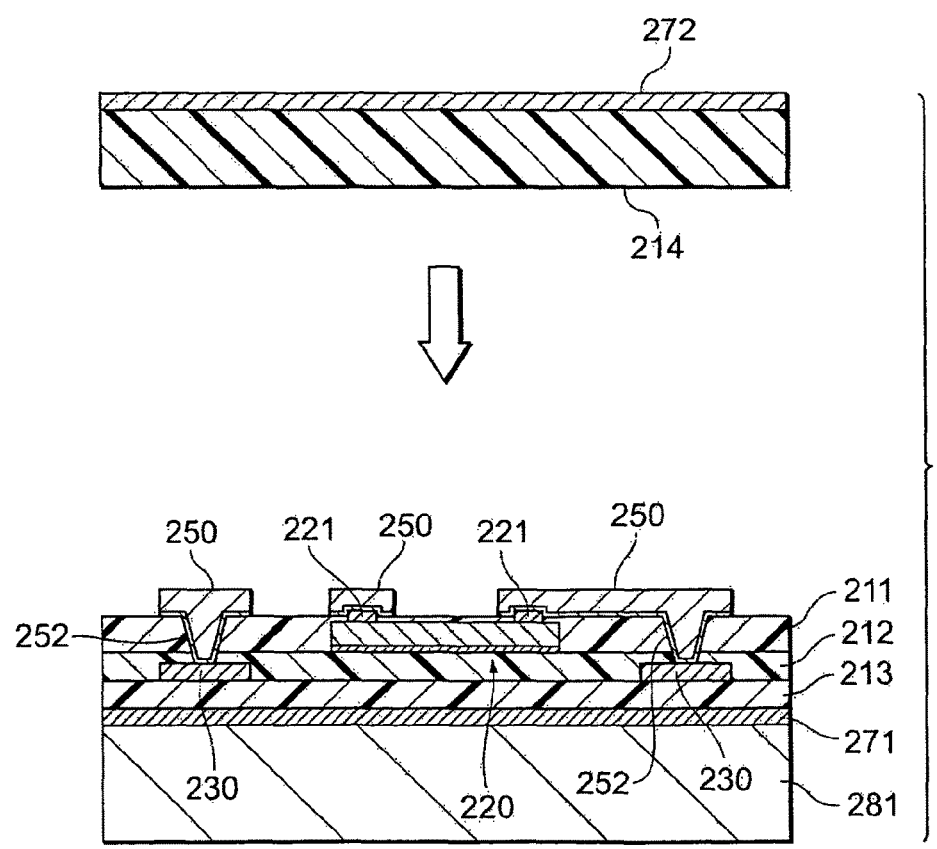
FIG. 15 is a step diagram showing one example of the procedure to manufacture the semiconductor-embedded substrate 200.

Subsequently, the dry films 201, 202 are peeled, and the unnecessary conductive underlayer 251 of a portion in which any wiring pattern 250 is not formed is removed (soft etching) using an etching liquid such as acid (FIG. 14).

Figure 16:
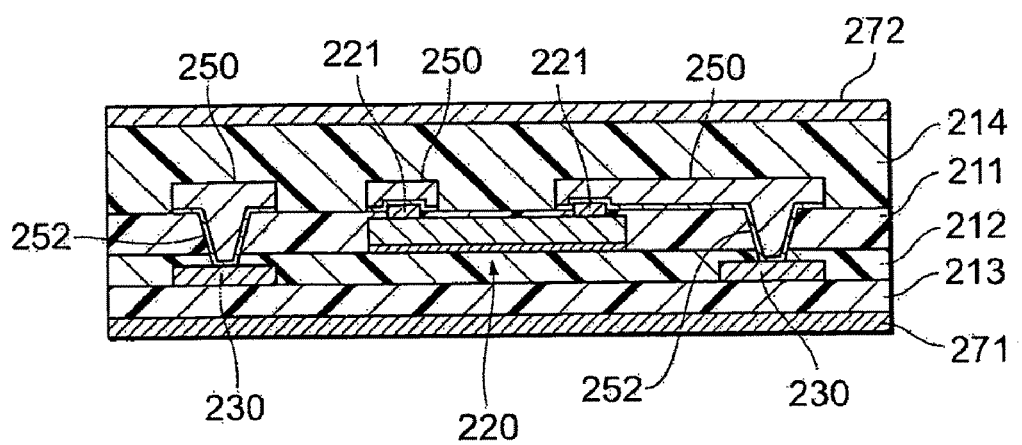
FIG. 16 is a step diagram showing one example of the procedure to manufacture the semiconductor-embedded substrate 200.

Then, a laminated sheet constituted of the resin layer 214 and a conductive layer 272 is superimposed so that the resin layer 214 faces the wiring patterns 250 (FIG. 15), and both the sheet and the patterns are pressed while heated. In consequence, after the wiring patterns 250 and the resin layer 211 are covered with the resin layer 214, the support substrate 281 is peeled (FIG. 16; an insulating layer forming step).

Furthermore, after the conductive layers 271, 272 are removed or thinned, through holes 213a, 213b and 214a are formed by an appropriate method such as the above-mentioned laser abrasion or the blast treatment. It is to be noted that the through holes 213a are through holes extending through the resin layer 213 to expose the alignment marks 230, the through holes 213b are through holes extending through the resin layers 213, 212 to expose the metal layer 222, and the through holes 214a are through holes extending through the resin layer 214 to expose the wiring patterns 250.

Figure 17:
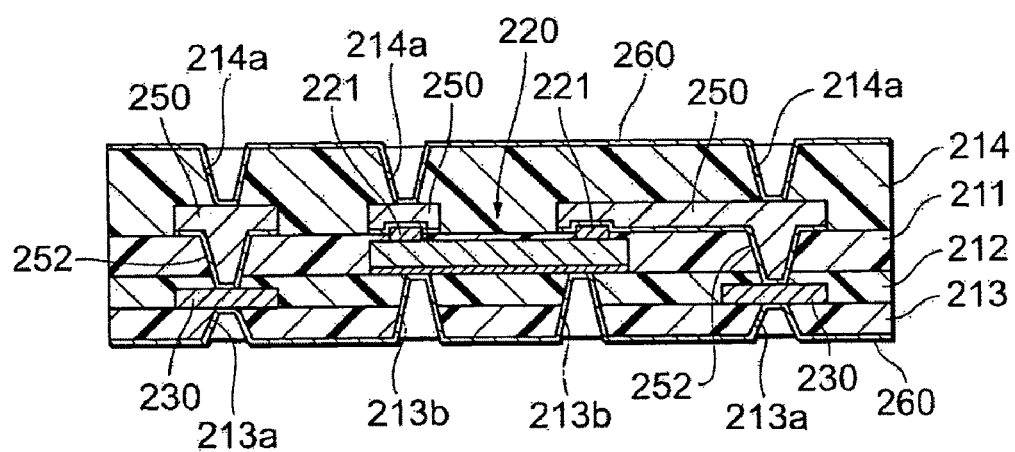
FIG. 17 is a step diagram showing one example of the procedure to manufacture the semiconductor-embedded substrate 200.

Then, a thin conductive underlayer 260 is formed on the whole surface including inner surfaces of the through holes 213a, 213b and 214a by a gas phase growth process such as the sputtering process (FIG. 17). Afterward, the wiring patterns 261, 262 of the outermost layer shown in FIG. 1 are formed in the same manner as in a procedure shown in FIGS. 11 to 13 (a wiring layer forming step). According to this step, the through holes 213a are filled with the through electrodes 263, whereby the wiring patterns 261 are connected to the alignment marks 230. Moreover, the through holes 213b are filled with the through electrodes 264, whereby the wiring patterns 261 are connected to the metal layer 222. Furthermore, the through holes 214a are filled with the through electrodes 265, whereby the wiring patterns 262 are connected to the wiring patterns 250.

According to the above procedure, the semiconductor-embedded substrate 200 shown in FIG. 1 is obtained.

According to the mounting method of the electronic components of the present invention, and the manufacturing method of the electronic component-embedded substrate by use of the mounting method, in a case where the semiconductor device 220 is mounted on the resin layer 212, the device is isotropically pressurized in the container 31 of the pressurizing and heating unit 3 via the internal gas G of the container, and pressed to the unhardened resin layer 212, so that the pressure to be applied to the semiconductor device 220 is prevented from being locally and unevenly distributed. Therefore, generation of such warp and bend that the peripheral edge portion of the semiconductor device 220 sinks in the unhardened resin layer 212 can be prevented, and the resin layer 212 is heated to harden in a state in which such warp and bend are inhibited, so that the semiconductor device 220 is fixed and mounted on the resin layer 212 in a remarkably flat state in which the warp and bend are inhibited.

Therefore, since the bumps 221 do not sink on the side of an underlayer, the bumps 221 can securely be exposed from the resin layer 212 with a defined amount of the resin layer 212 to be etched, so that the bumps 221 can securely be connected to the wiring patterns 250. Therefore, deterioration of manufacturing yield of the semiconductor-embedded substrate 200 can be prevented, and high reliability of the substrate can be realized.

Moreover, since such warp and bend that the peripheral edge portion of the semiconductor device 220 sinks in the unhardened resin layer 212 can be prevented, it can be prevented that the resin in the vicinity of an outer periphery of the semiconductor device 220 rises at a peripheral wall of the device and becomes porous. Therefore, it is possible to sufficiently inhibit deterioration of a fixing strength between the semiconductor device 220 and the resin layer 212 at the peripheral edge portion of the semiconductor device 220 due to such porous resin, deterioration of a transverse strength of the semiconductor-embedded substrate 200 itself, and generation of foaming (generation of a void) at a bonding interface between the semiconductor device 220 and the resin layer 212 in the subsequent thermal step due to humidity absorption at a void portion of the resin layer 212 as well as inflow of water into the back surface 220b of the semiconductor device 220. As a result, it can be prevented that the semiconductor device 220 easily peels from the resin layer 212 and that the strength of the semiconductor-embedded substrate 200 deteriorates.

Figure 18:
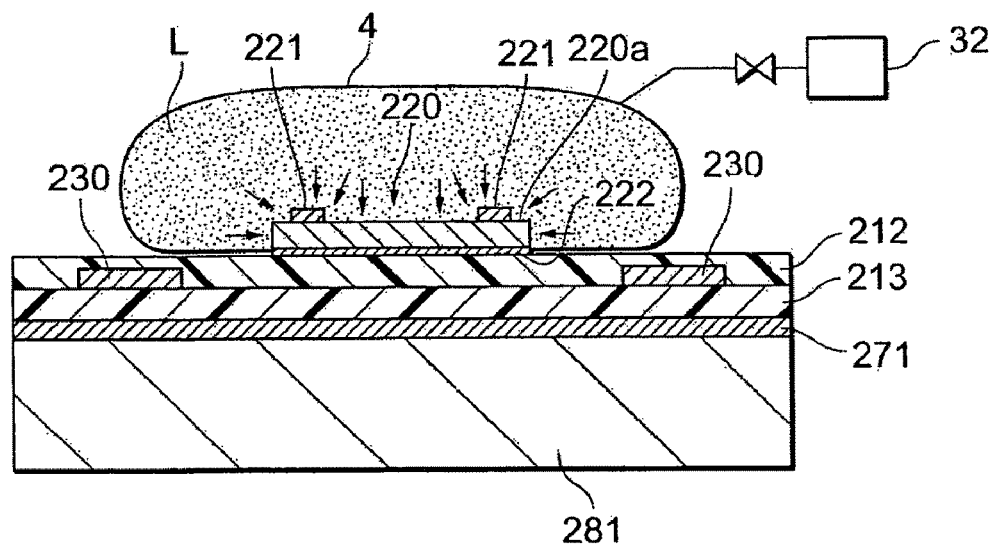
FIG. 18 is a step diagram showing a state in which another embodiment of a mounting method of electronic components according to the present invention is performed.
Figure 19:
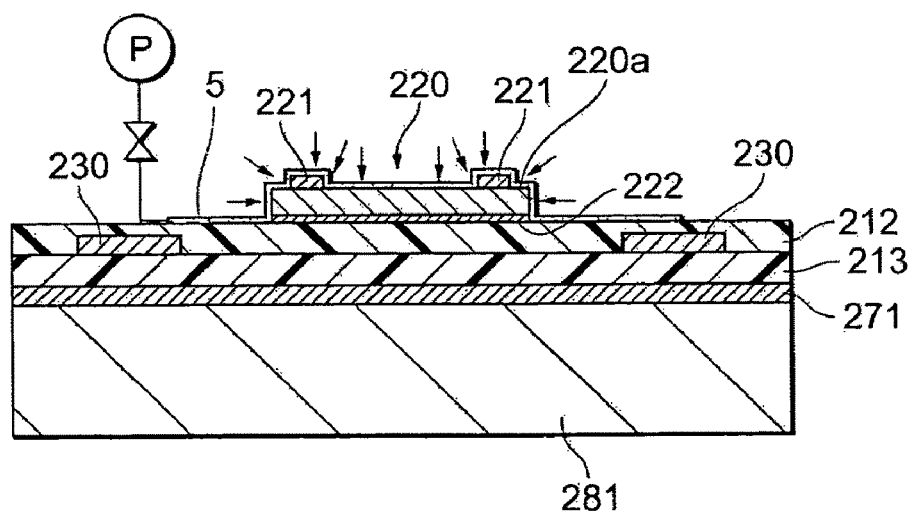
FIG. 19 is a step diagram showing a state in which the other embodiment of the mounting method of the electronic components according to the present invention is performed.
Figure 20:
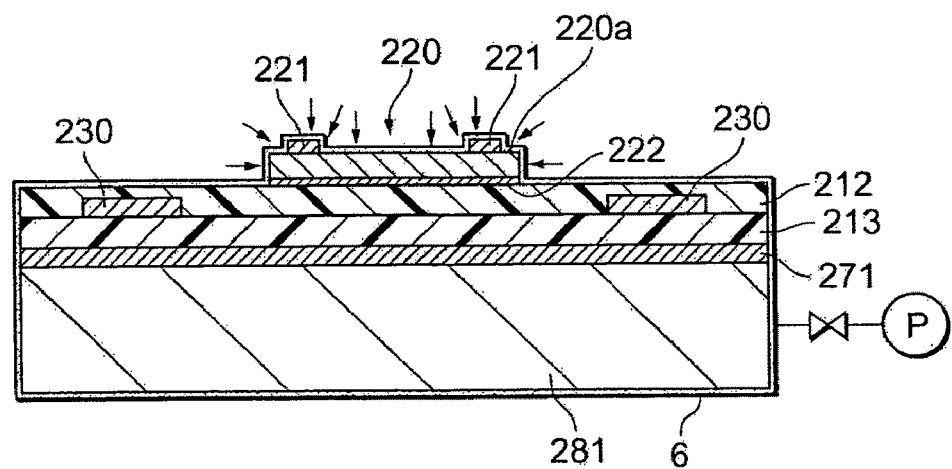
FIG. 20 is a step diagram showing a state in which the other embodiment of the mounting method of the electronic components according to the present invention is performed.

FIGS. 18 to 20 are step diagrams showing a state in which another embodiment of the mounting method of the electronic components according to the present invention is performed suitably in a case where the semiconductor device 220 is mounted on the resin layer 212, and are diagrams schematically showing another example of the pressurizing step.

In an example shown in FIG. 18, first an unhardened resin layer 212 which has been obtained by the procedure shown in FIGS. 2 to 5 and on which a semiconductor device 220 is disposed is covered with a bag-like film 4 (e.g., a thin film made of a resin or a rubber) having a stretching property or flexibility so as to cover the whole bare surface (i.e., the whole shown upper portion of the semiconductor device 220)

including a main surface 220a of the semiconductor device 220 and the surfaces of bumps 221. Subsequently, a fluid L such as a gas or a liquid is injected into the bag-like film 4 to pressurize the inside of the film 4. In consequence, since the film 4 has the stretching property or flexibility, as shown in the drawing, the film is pressed so as to come in close contact with the whole surface of the semiconductor device 220 and the surface of the resin layer 212 around the device, and a pressure applied into the film 4 is isotropically applied to the semiconductor device 220 and the resin layer 212 around the device (a pressurizing step). That is, the film 4 functions as a partition wall (a diaphragm) which isotropically pressurizes the semiconductor device 220 with the fluid L supplied into the film. In this case, the film 4 and the fluid L in the film function as pressurizing means as a pressure medium. It is to be noted that in the drawing, to facilitate visual recognition of the part of the film 4, an upper surface of the resin layer 212 is drawn away from a lower surface of the film 4, but in actual both the surfaces come in close contact with each other.

Moreover, in an example shown in FIG. 19, first an unhardened resin layer 212 which has been obtained by the procedure shown in FIGS. 2 to 5 and on which a semiconductor device 220 is disposed is covered with a film 5 (e.g., a thin film made of a resin or a rubber) having a stretching property or flexibility so as to cover the whole bare surface (i.e., the whole shown upper portion of the semiconductor device 220) including a main surface 220a of the semiconductor device 220 and the surfaces of bumps 221. Subsequently, air of a space between the film 5 and the semiconductor device 220 is discharged by exhaust means P such as a vacuum pump, and the semiconductor device 220 and the film 5 are attached to each other in a substantial vacuum state (vacuum-laminated). In consequence, since the film 5 has the stretching property or flexibility, as shown in the drawing, the film is pressed so as to come in close contact with the whole surface of the semiconductor device 220 and the surface of the resin layer 212 around the device, and the semiconductor device 220 and the resin layer 212 around the device are isotropically pressurized from the outside of the film 5 with an atmospheric pressure (a pressurizing step). In this case, the film 5 functions as a partition wall (a diaphragm) which separates a substantially evacuated space between the film 5 and the semiconductor device 220 from a surrounding atmosphere having the atmospheric pressure and which isotropically pressurizes the semiconductor device 220. In this example, the film 5 and the atmosphere function as pressurizing means as a pressure medium.

Furthermore, in an example shown in FIG. 20, first the whole unhardened resin layer 212 which has been obtained by the procedure shown in FIGS. 2 to 5 and on which a semiconductor device 220 is disposed is stored in a bag-like film 6 (e.g., a thin film made of a resin or a rubber) having a stretching property or flexibility. Subsequently, air in the bag-like film 6 is discharged by exhaust means P such as a vacuum pump, and the semiconductor device 220 and the film 6 are attached to each other in a substantial vacuum state (vacuum-laminated). In consequence, since the film 6 has the stretching property or flexibility, as shown in the drawing, the film is pressed so as to come in close contact with the whole surface of the semiconductor device 220 and the surface of the resin layer 212 around the device, and the semiconductor device 220 and the resin layer 212 are isotropically pressurized from the outside of the film 6 with an atmospheric pressure (a pressurizing step). In this case, the film 6 functions as a partition wall (a diaphragm) which separates a substantially evacuated space in the bag-like film 6 from a surrounding atmosphere having the atmospheric pressure and which isotropically pressurizes the semiconductor device 220 and the whole resin layer 212. Also in this example, the film 6 and the atmosphere function as pressurizing means as a pressure medium.

Afterward, a constitution subjected to the pressurizing step by use of the films 4 to 6 as described above is stored in a drying machine or the like, or disposed on a support base (a table) having a heating function, for example, a heater plate or a heater stage, and the whole constitution is heated to soften the resin layer 212 and further harden the layer, whereby fixing and mounting of the semiconductor device 220 on the resin layer 212 are completed. The constitution obtained in this manner is subjected to the same procedure as that described above with reference to FIGS. 7 to 17, thereby obtaining the semiconductor-embedded substrate 200 shown in FIG. 1.

According to such a mounting method of the electronic components and the manufacturing method of the electronic component-embedded substrate 200 by use of the mounting method of the present invention, in a case where the semiconductor device 220 is mounted on the resin layer 212, the device is isotropically pressurized with respect to the unhardened resin layer 212, so that the pressure to be applied to the semiconductor device 220 is prevented from being locally and unevenly distributed. Therefore, the generation of such warp and bend that the peripheral edge portion of the semiconductor device 220 sinks in the unhardened resin layer 212 and rising of the resin layer 212 around the semiconductor device 220 can be inhibited, and the resin layer 212 is heated to harden in this state, so that the semiconductor device 220 is fixed and mounted on the resin layer 212 in the remarkably flat state in which the warp and bend are inhibited.

Therefore, the bumps 221 of the semiconductor device 220 can securely be connected to the wiring patterns 250, so that the deterioration of the manufacturing yield of the semiconductor-embedded substrate 200 can be prevented, and the high reliability of the substrate can be realized. Moreover, it can be prevented that the resin in the vicinity of the peripheral edge portion of the semiconductor device 220 rises at the peripheral wall of the device and becomes porous. Therefore, it is possible to sufficiently inhibit the deterioration of a binding strength between the semiconductor device 220 and the resin layer 212, the deterioration of the transverse strength of the semiconductor-embedded substrate 200, and the foaming at the bonding interface due to the inflow of water into the back surface 220b of the semiconductor device 220. As a result, it can be prevented that the semiconductor device 220 easily peels from the resin layer 212, and the strength of the semiconductor-embedded substrate 200 can sufficiently be maintained.

Figure 22:
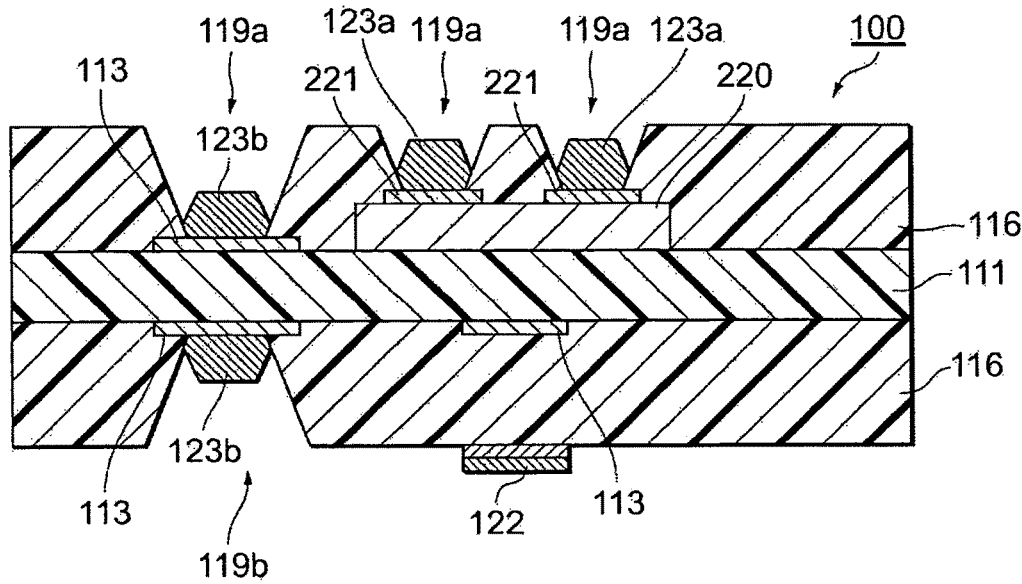
FIG. 22 is a sectional view showing a main part of one example of an electronic component-embedded substrate manufactured by a manufacturing method of the electronic component-embedded substrate according to the present invention.

FIG. 22 is a sectional view showing a main part of another example of an electronic component-embedded substrate manufactured by the manufacturing method of the electronic component-embedded substrate according to the present invention.

In a semiconductor-embedded substrate 100 (an electronic component-embedded substrate), conductive patterns 113 are formed at both surfaces of a core substrate 111, and in a resin layer 116 laminated on the core substrate 111, a semiconductor device 220 is arranged. The resin layers 116 are provided with via-holes 119a, 119b so that the conductive patterns 113 arranged at a lower part/an upper part (a core substrate 111 side) of the layers and in the layers and bumps 221 of the semiconductor device 220 are protruded from the resin layers 116. In the via-holes 119a, 119b, the bumps 221 and the conductive patterns 113 are connected to via-hole electrode portions 123a, 123b of conductive patterns 122, respectively.

Moreover, the via-hole electrode portions 123a, 123b are formed so as to include trapezoidal sectional portions shown in the drawing. In other words, substantially upper half portions are formed so as to broaden toward ends so that sectional areas increase toward the conductive patterns 113 and the bumps 221. The electrode portions on opposite sides come in contact with vicinities of bottom portions of inner walls of the via-holes 119a, 119b, and do not come in contact with portions above the bottom portions, and space areas (voids) are defined between the inner walls of the via-holes 119a, 119b and the via-hole electrode portions 123a, 123b. Furthermore, side wall slope ends of the via-hole electrode portions 123a, 123b are formed so as to abut on side walls of the via-holes 119a, 119b.

The core substrate 111 performs a role as a base to secure a mechanical strength of the whole semiconductor-embedded substrate 100, and there is not any special restriction on the core substrate, but, for example, a resin substrate or the like may be used. As a material of the resin substrate, it is preferable to use a material of resin cloth such as glass cloth, Kevlar, aramid or liquid crystal polymer or a core material constituted of a porous sheet of a fluorine resin or the like impregnated with a thermosetting resin, a thermoplastic resin or the like, and it is preferable that a thickness of the material is about 20 μm to 200 μm. As an application of a substrate to be subjected to laser processing, for a purpose of homogenization of processing conditions, a coreless sheet material such as LCP, PPS, PES, PEEK or PI may be used.

The via-holes 119a, 119b are connection holes provided at the resin layer 116 in order to physically connect the conductive patterns 113 as bodies to be wired and the semiconductor device 220 to the conductive patterns 122, and have such positions and depths that at least a part of the conductive patterns 113 and the bumps 221 of the semiconductor device 220 is exposed from the resin layer 116. That is, the conductive patterns 113 and the bumps 221 are provided so that at least a part of them is exposed at the bottom portions of the via-holes 119a, 119b.

There is not any special restriction on a method for forming the via-holes 119a, 119b, and a known method such as laser processing, etching processing or blast processing may be used. When the laser processing is performed, smear is generated, and hence it is preferable to perform a de-smear treatment after the connection holes are formed.

Configurations of the via-holes 119a, 119b may have such a dimensional shape that the conductive patterns 113 and the bumps 221 can physically be connected to the via-hole electrode portions 123a, 123b in these holes, and can appropriately be determined in consideration of depths of the holes, targeted mounting density, targeted connection stability or the like, and examples of the configuration include a cylindrical configuration in which an opening end has a diameter of about 5 to 200 μm and a square tubular configuration having a maximum diameter of about 5 to 200 μm. The configuration may be a straight tube or not. In the drawing, as an example, inversely pyramid configurations are shown. Such via-holes 119a, 119b having a width diameter which gradually increases from a bottom portion toward an opening end portion may be pierced by, for example, etching processing, blast processing or the like.

Moreover, the conductive patterns 122 are wiring layers which electrically connect the conductive patterns 113 as bodies to be wired to the bumps 221. There is not any special restriction on a material of this conductive pattern 122, a conductor such as a metal generally for use in wiring may be used, and the material may be the same as or different from that of the conductive pattern 113 or the bump 221. In a case where forming of the conductive patterns 122 includes an etching step, an etchant (an etching solution for wet etching, etchant particles for dry etching or the like) which does not etch the material of the conductive pattern 113 or the bump 221 may appropriately be selected for use.

Furthermore, there is not any special restriction on a thickness of the conductive pattern 122, but if the pattern is excessively thin, connection stability drops, and hence the thickness is usually about 5 to 70 μm. When the thickness of the conductive pattern 122 is set to be smaller than the depth of the via-holes 119a, 119b, in via-hole connecting portions, the conductive patterns 122 (the via-hole electrode portions 123a, 123b) are stored in the via-holes 119a, 119b, and a wiring height is reduced, thereby contributing to thinning. Moreover, an amount to be wired can be reduced to lower a wiring resistance and a parasitic capacity, and the connection stability can preferably be improved.

Next, one example of the manufacturing method of the semiconductor-embedded substrate 200 will be described with reference to the drawings. FIGS. 23 to 32 are step diagrams showing one example of a procedure of manufacturing the semiconductor-embedded substrate 100.

Figure 23:
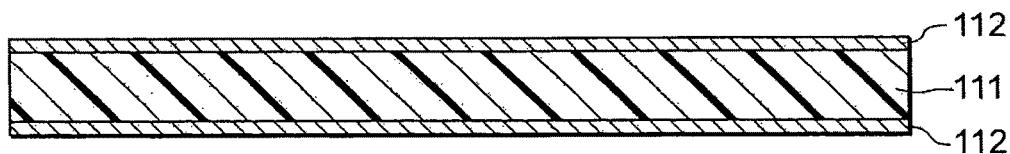
FIG. 23 is a step diagram showing one example of a procedure to manufacture a semiconductor-embedded substrate 100.

First, a resin substrate having both surfaces provided with copper foils, in which copper foils 112 are attached to both surfaces of a core substrate 111, is prepared (FIG. 23). Here, the copper foils 112 are to form conductive patterns 113, and when an electrolytic copper foil (copper dissolved and ionized in an aqueous copper sulfate solution is continuously electrically deposited with an electrodeposition roller to form the copper foil) manufactured for a printed wiring board or a rolled copper foil is used, fluctuations of the thickness of the foil can remarkably be reduced. If necessary, the thickness of the copper foil 112 may be regulated by a technique such as SWEP.

Figure 24:
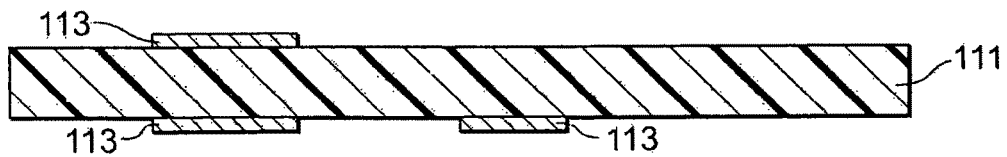
FIG. 24 is a step diagram showing one example of the procedure to manufacture the semiconductor-embedded substrate 100.

Subsequently, the copper foils 112 provided on both the surfaces of the core substrate 111 are selectively removed by photolithography and etching to form the conductive patterns 113 on the core substrate 111 (FIG. 24). At this time, the copper foils 112 present on predetermined areas of the core substrate 111 are entirely removed to secure a mounting area for a semiconductor device 220.

Figure 25:
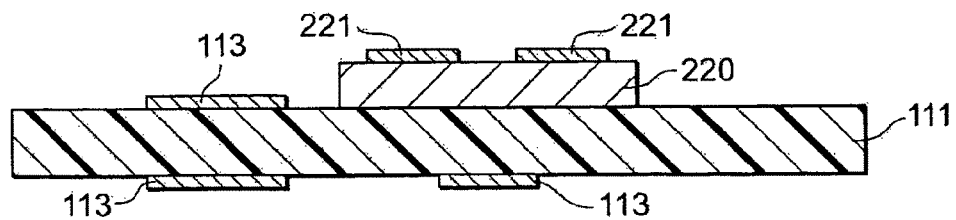
FIG. 25 is a step diagram showing one example of the procedure to manufacture the semiconductor-embedded substrate 100.

Subsequently, the predetermined areas of the core substrate 111 are coated with an unhardened adhesive (not shown: an unhardened resin) formed of a resin composition, and the semiconductor device 220 is disposed in a so-called face-up state (FIG. 25). Then, the core substrate 111 on which this semiconductor device 220 has been disposed is subjected to a pressurizing step and a heating step in the same manner as in FIGS. 6, 18 to 20 described above, and the adhesive is hardened to fix and mount the semiconductor device 220 on the core substrate 111 (coated with the adhesive).

Figure 26:
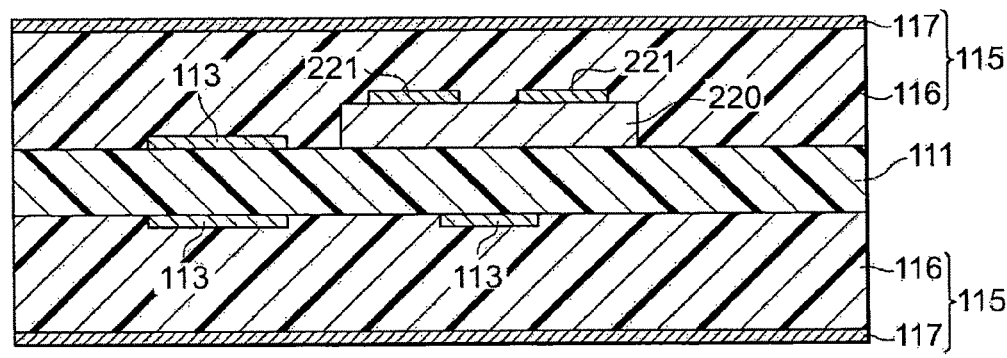
FIG. 26 is a step diagram showing one example of the procedure to manufacture the semiconductor-embedded substrate 100.

Subsequently, resin sheets 115 each having one surface provided with a copper foil are attached to both surfaces of the core substrate 111 on which the semiconductor device 220 has been disposed (FIG. 26). In the resin sheet 115 having one surface provided with the copper foil according to the present manufacturing example, a resin sheet 117 is attached to one surface of a thermosetting resin sheet 116 made of an epoxy resin of stage B or the like. Such resin sheets 115 each having one surface provided with the copper foil are prepared, resin surfaces of the sheets are attached to both surfaces of the core substrate 111, respectively, and then the sheets are hot-pressed to integrate, with the core substrate 111, the resin sheets 115 each having one surface provided with the copper foil. In consequence, the semiconductor device 220 is embedded in the printed wiring board, and the thermosetting resin sheets 116 form resin layers 116.

Figure 27:
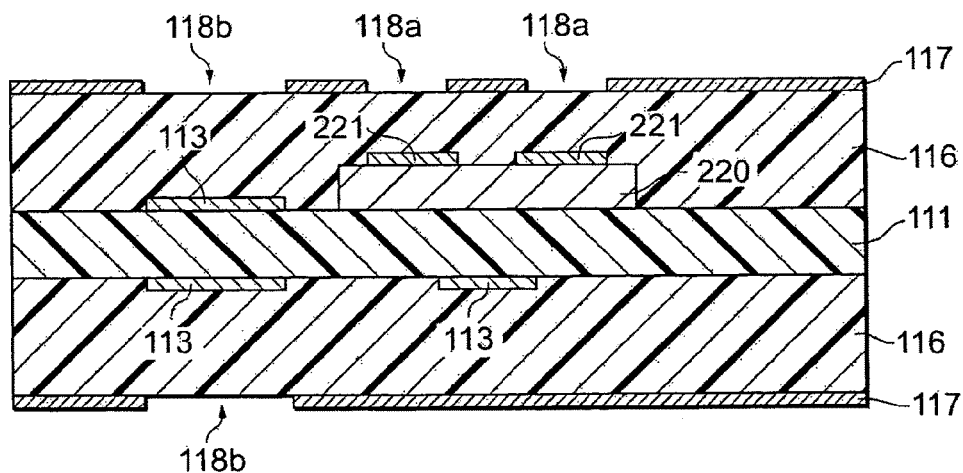
FIG. 27 is a step diagram showing one example of the procedure to manufacture the semiconductor-embedded substrate 100.

Subsequently, the resin sheets 117 provided on the surfaces of the resin layers 116 are selectively removed by conformal processing to form a mask pattern for forming via-holes 119a, 119b (FIG. 27). It is preferable to perform the conformal processing by photolithography and etching, because highly precise and fine processing can be realized. It is to be noted that there is not any special restriction on an opening width diameter of the mask pattern, but it is preferable to set the diameter to about 10 to 200 μm, and it is preferable to increase the opening width diameter based on the depth of the via-holes 119a, 119b. In consequence, opening patterns 118a are formed right above bumps 221 of the semiconductor device 220, and opening patterns 118b are formed right above conductive patterns 113 formed on the surface of the core substrate 111.

Figure 28:
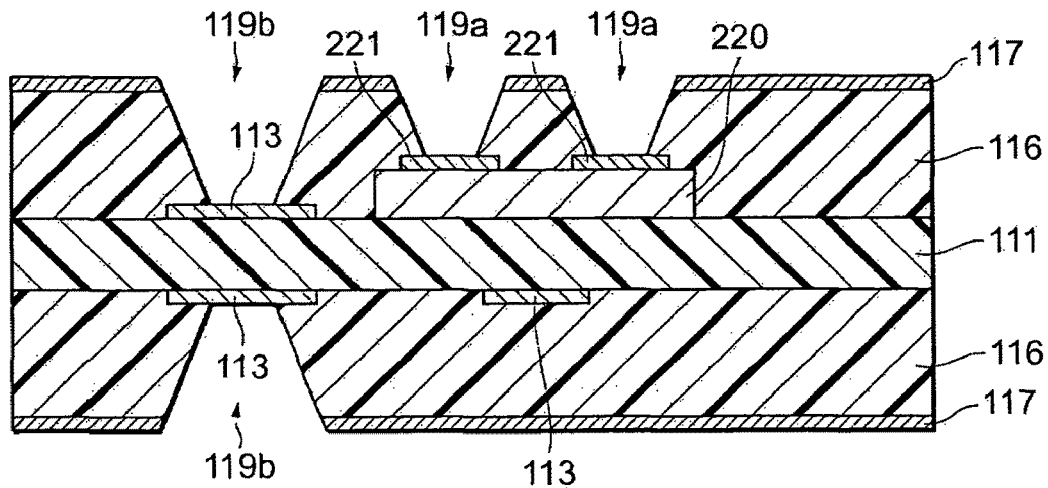
FIG. 28 is a step diagram showing one example of the procedure to manufacture the semiconductor-embedded substrate 100.

Then, the via-holes 119a, 119b are formed by a sand blast treatment using the resin sheet 117 subjected to the conformal processing as a mask (FIG. 28). In the sand blast treatment, blast particles such as non-metal particles or metal particles are projected to grind a body to be processed, but metal layers such as the bumps 221 and the conductive patterns 113 can be provided right under the opening patterns 118a, 118b to selectively form the via-holes having different depths. In this case, when the via-holes 119a are formed, the bumps 221 function as stoppers, so that the semiconductor device 220 can be prevented from being damaged by the blast particles. Moreover, when the via-holes 119b are formed, the conductive patterns 113 of inner layers function as stoppers, so that the via-holes 119b are inhibited from being dug deeper. Thus, a structure is formed in which the via-holes 119a, 119b are constituted as non-through holes, and the bumps 221 or the conductive patterns 113 are exposed at the bottom portions of the via-holes 119a, 119b, respectively.

Figure 29:
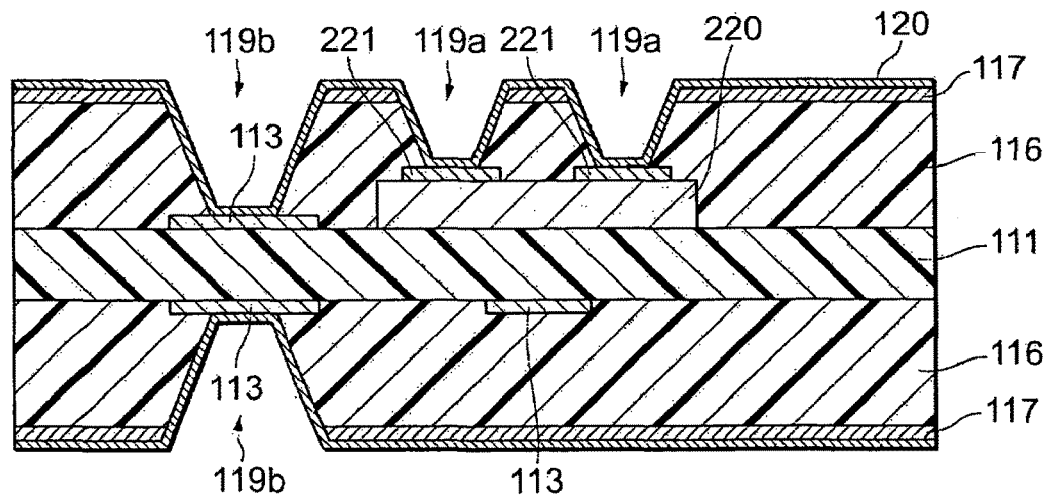
FIG. 29 is a step diagram showing one example of the procedure to manufacture the semiconductor-embedded substrate 100.
Figure 30:
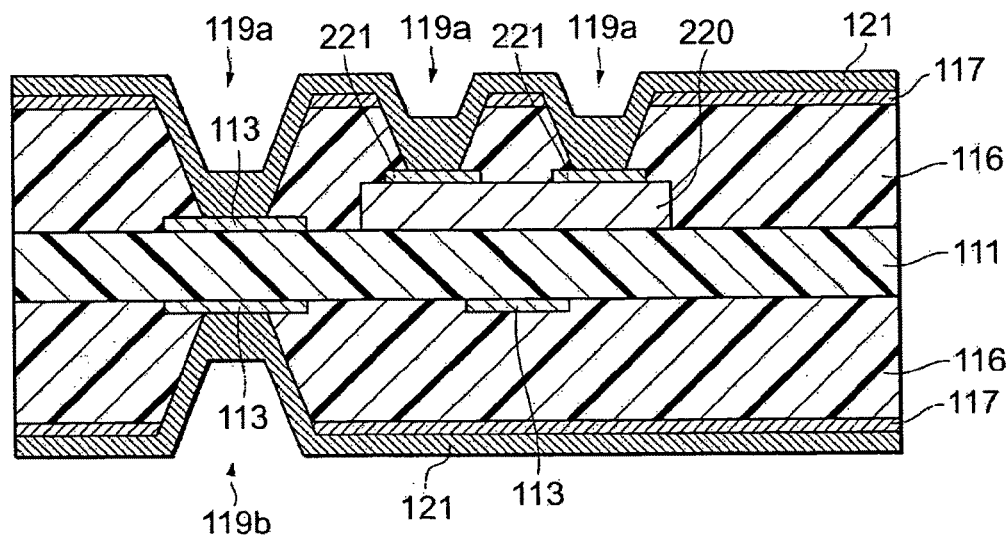
FIG. 30 is a step diagram showing one example of the procedure to manufacture the semiconductor-embedded substrate 100.

Subsequently, a conductive underlayer 120 is formed over the whole exposed surface of the via-holes 119a, 119b including inner wall surfaces of the via-holes 119a, 119b (FIG. 29). It is preferable to use an electroless plating (chemical plating) process as a method for forming the conductive underlayer 120, but a sputtering process, an evaporation process or the like may be used. The conductive underlayer 120 performs a role of an underlayer metal (or a seed layer) for electrolytic (electric) plating to be subsequently performed, and may have a small thickness, and the thickness can appropriately be selected from a range of, for example, several ten nm to several μm. Subsequently, a conductor metal is developed from the conductive underlayer 120 by an electrolytic plating process (FIG. 30). In consequence, conductive layers 121 including the conductive underlayers 120 are formed on the inner wall surfaces of the via-holes 119a, 119b.

Figure 31:
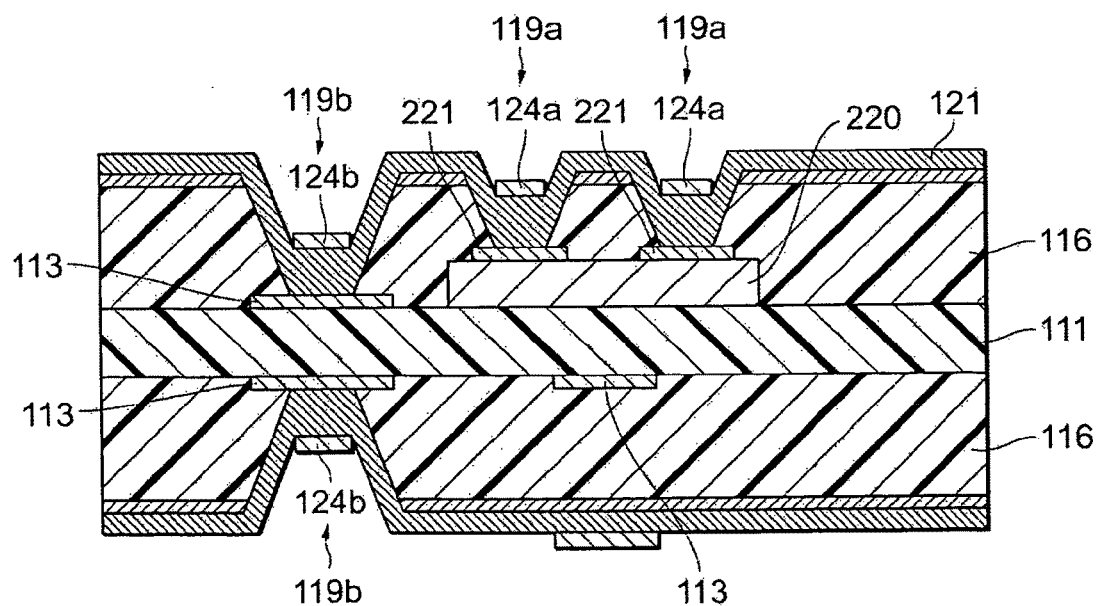
FIG. 31 is a step diagram showing one example of the procedure to manufacture the semiconductor-embedded substrate 100.

Afterward, resist layers 124a, 124b are formed on areas forming conductive patterns 122 of the conductive layers 121 by photolithography (FIG. 31). Here, in order to form via-hole electrode portions 123a, 123b of the conductive patterns 122 so that the portions do not come in contact with inner walls of the via-holes 119a, 119b, the resist layers 124a, 124b are formed so that widths of the resist layers 124a, 124b in the via-holes 119a, 119b are smaller than upper opening width diameters ra, rb of the via-holes.

Figure 32:
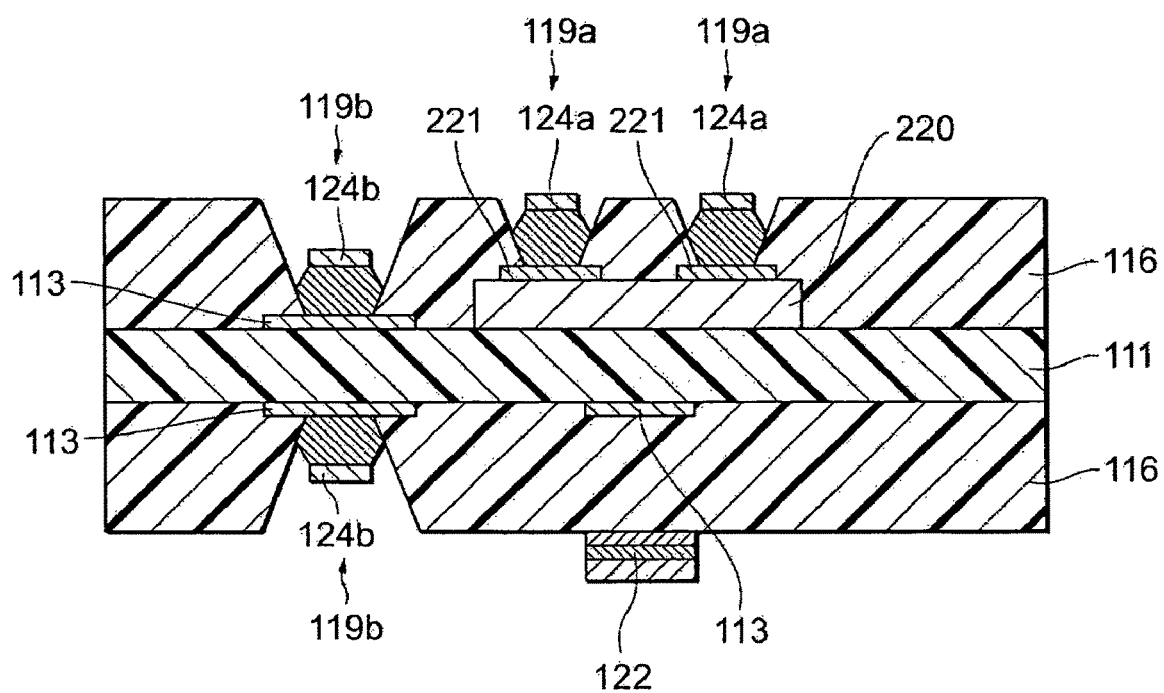
FIG. 32 is a step diagram showing one example of the procedure to manufacture the semiconductor-embedded substrate 100.

Subsequently, etching is performed using the resist layers 124a, 124b as an etching mask to selectively remove the conductive layer 121 other than a wiring pattern portion, and the conductive patterns 122 (the via-hole electrode portions 123a, 123b) are formed (FIG. 32). At this time, since an etching rate of the conductive layer 121 around the mask is smaller than that of another portion, the via-hole electrode portions 123a, 123b as wiring layers to be formed have such a shape as to broaden toward an end.

Then, the resist layers 124a, 124b on the conductive patterns 122 are removed using a peeling solution to obtain the semiconductor-embedded substrate 100 having the constitution shown in FIG. 1.

Even in the semiconductor-embedded substrate 100 obtained in this manner, a function and an effect similar to those of the above-mentioned semiconductor-embedded substrate 200 can be obtained.

It is to be noted that as described above, the present invention is not limited to the above embodiment, and can variously be modified without departing from the scope. For example, in the semiconductor-embedded substrate 200, a passive component such as a resistance or a capacitor can be mounted on at least one of the wiring patterns 261, 262 of the outermost layer. Instead of simultaneously performing the pressurizing step and the heating step, the pressurizing and heating unit 3 may perform the heating step after performing the pressurizing step. Conversely, to perform the pressurizing step as shown in FIGS. 18 to 20, a substrate on which the semiconductor device 220 has been disposed may be stored and installed at a drying machine, a heating base or the like to simultaneously perform the heating step. Furthermore, to form the wiring pattern, a catalyst layer may be provided instead of the conductive underlayers 251, 260, and electroless plating may be performed, instead of the electrolytic plating, to form the wiring pattern. In a case where the conductive underlayer 251 is replaced with the catalyst layer to perform the electroless plating, the support substrate 281 does not have to be covered with the dry film 202.

EXAMPLES

Specific examples of the present invention will be described, but the present invention is not limited to these examples.

Example 1

A flat plate-like base was coated with an unhardened resin with a thickness of 60 μm and in the form of a sheet, a semiconductor IC (a semiconductor device as an electronic component) having a vertical size of 5 mm×a lateral size of 5 mm×a thickness of 50 μm in a bare chip state was disposed on the base by use of a die bonder so that a back surface (a surface on which any bump was not formed) of the IC abutted on a resin, and the semiconductor device tentatively set on an unhardened resin layer was produced in the same manner as in the state shown in FIG. 5. Subsequently, this was stored in a pressurizing and heating tank of a pressurizing and heating unit, and pressurized and heated on predetermined conditions by use of a nitrogen gas as a pressure medium, whereby the semiconductor IC and the unhardened resin were isotropically pressurized. While the semiconductor IC was pressed to the unhardened resin layer while softening and further hardening the resin layer, and a mounted article was obtained in which the semiconductor IC was fixed onto the resin layer (an insulating layer). It is to be noted that the heating and the pressurizing were performed in a range of the above-mentioned heating and pressurizing conditions.

Comparative Example 1

A semiconductor device tentatively set on an unhardened resin layer produced in the same manner as in Example 1 and having a constitution similar to that shown in FIG. 5 was pressed as it was with a collet of a die bonder, and pressurized with a force of 3 N for ten seconds to press an semiconductor IC to the resin layer. Subsequently, this was stored in a drying machine, and dried under an atmospheric pressure at 150° C. for 30 minutes to harden the resin layer, and a mounted article was obtained in which the semiconductor IC was fixed onto the resin layer (an insulating layer).

<Evaluation 1>

Figure 33:
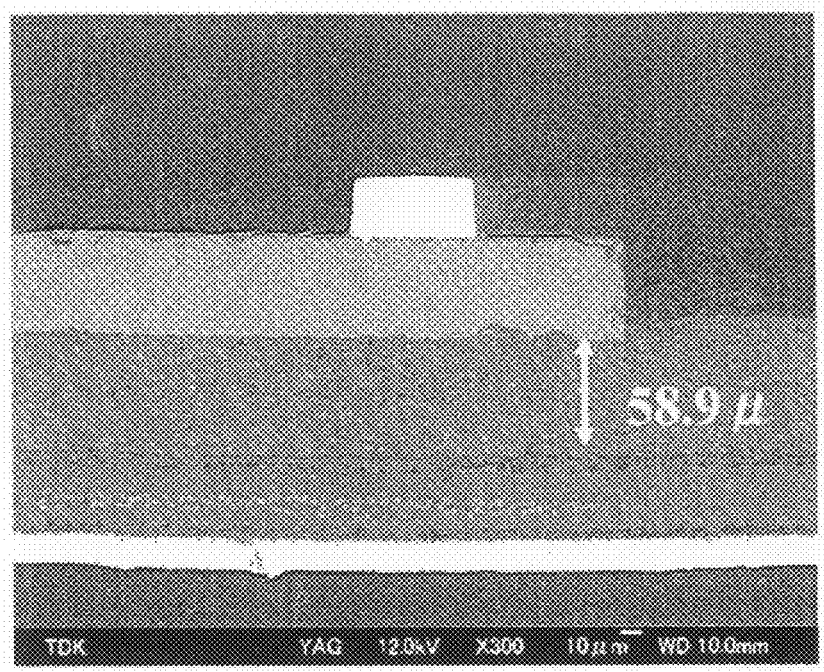
FIG. 33 is an electronic microscope photograph of both end portions of a section in a mounted article of Example 1.
Figure 34:
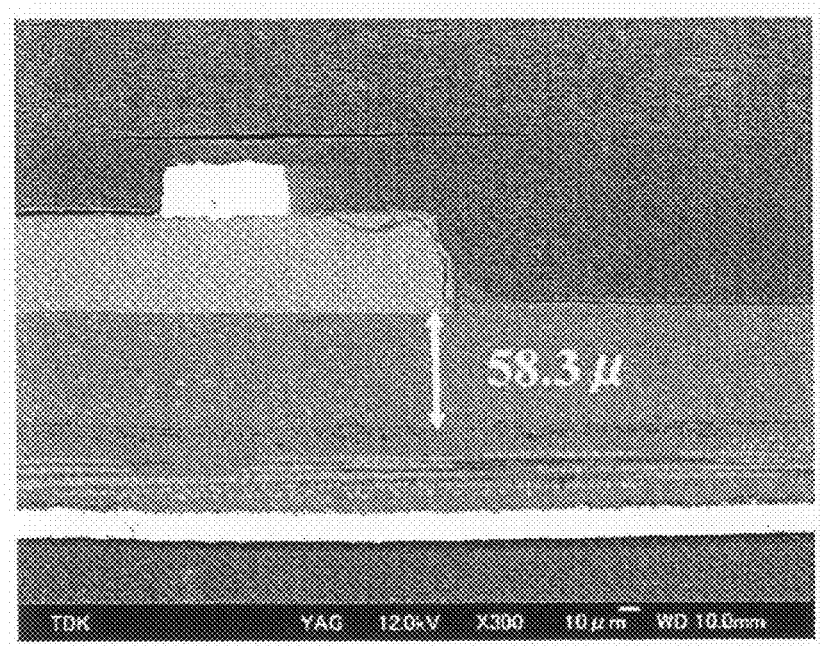
FIG. 34 is an electronic microscope photograph of both end portions of the section in the mounted article of Example 1.
Figure 35:
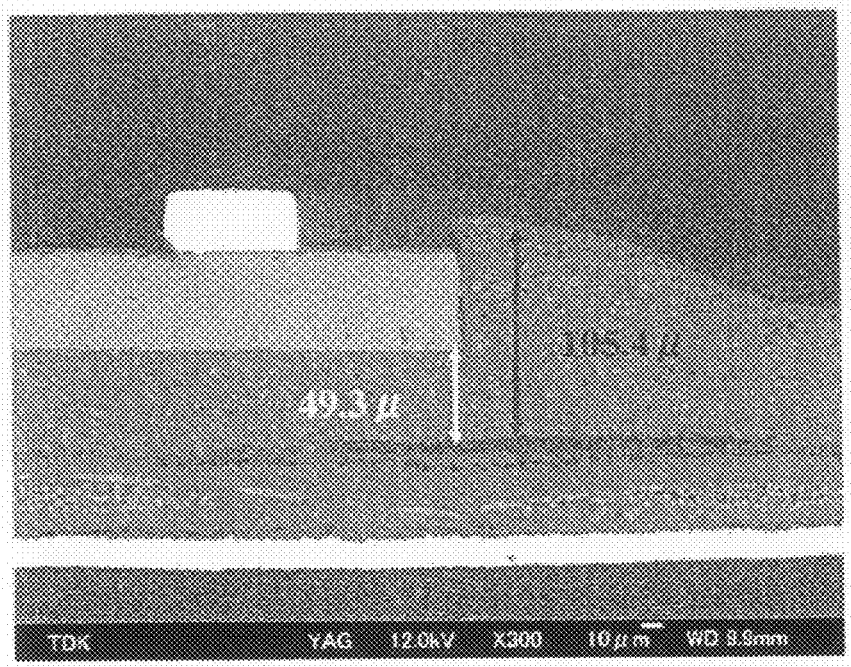
FIG. 35 is an electronic microscope photograph of both end portions of a section in a mounted article of Comparative Example 1.
Figure 36:
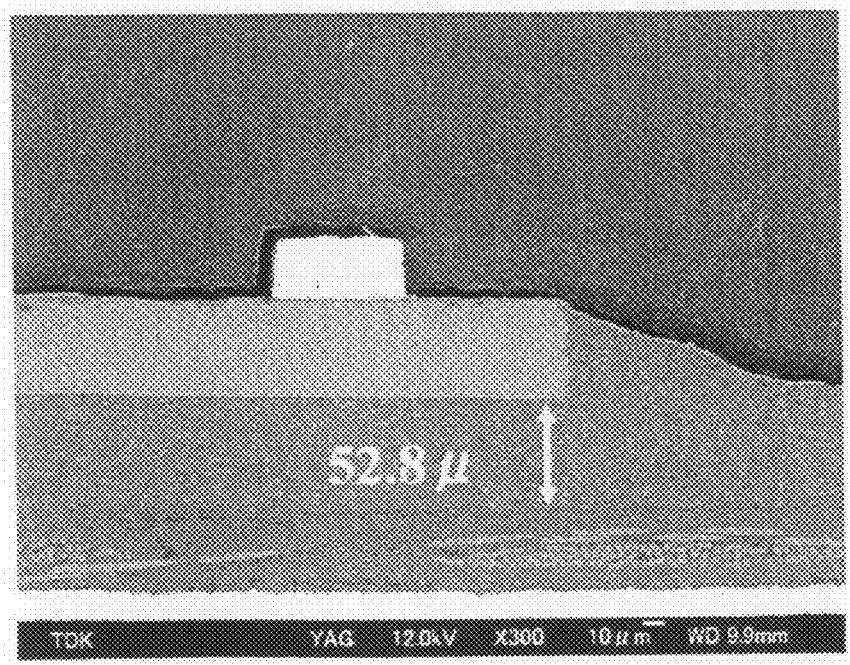
FIG. 36 is an electronic microscope photograph of both end portions of the section in the mounted article of Comparative Example 1.

The mounted articles obtained in Example 1 and Comparative Example 1 were cut along one direction in which the center of the semiconductor IC was disposed, images of sections of the articles were picked with an electronic microscope, and thicknesses of resin layers at both end portions provided with bumps and in the center of each article were measured. Here, FIGS. 33 and 34 are electronic microscope photographs of both the end portions of the section in the mounted article of Example 1. Moreover, FIGS. 35 and 36 are electronic microscope photographs of both the end portions of the section in the mounted article of Comparative Example 1. As a result, in both the mounted articles of Example 1 and Comparative Example 1, the resin layer under the center of the semiconductor IC had a thickness of approximately 60 µm. The thicknesses of the resin layer at both the end portions of the section were 58.9 µm and 58.3 µm, respectively, in the mounted article of Example 1, whereas the thicknesses were 49.3 µm and 52.8 µm, respectively, in the mounted article of Comparative Example 1. It is to be noted that in the photographs of FIGS. 33 to 36, a double-arrow mark shown under the end portion of the semiconductor IC indicates a thickness range of the resin layer at the portion, and attached numerals indicate the thickness of each resin layer at the portion.

It has been clarified from these results that in the method of the present invention in which the semiconductor IC tentatively set on the unhardened resin layer is isotropically pressurized and the resin layer is heated to harden in the state, such warp and bend of the semiconductor IC that peripheral edge portions of the semiconductor IC sink in the resin layer hardly occur, whereas in a conventional method in which the semiconductor IC is pressed with a grasping tool such as the die bonder, the peripheral edge portions of the semiconductor IC sink as much as significant amounts in the resin layer.

Moreover, as apparent from FIGS. 33 and 34, in the mounted article of Example 1, the resin layer scarcely rises on the side of the peripheral wall of the semiconductor IC. On the other hand, as apparent from FIGS. 35 and 36, in the mounted article of Comparative Example 1, it was confirmed that the resin layer rose as much as a remarkable amount on the side of the peripheral wall of the semiconductor IC. Especially, a long double-arrow mark added to FIG. 35 indicates a thickness range of the resin layer at the portion on the side of the peripheral wall of the semiconductor IC. As further described in the drawing, the thickness of the layer was 105.4 µm, and the layer rose to a position above a height of a main surface (an upper surface) of the semiconductor IC. With regard to such a rise of a resin in the mounted article of Comparative Example 1, it is supposed that the peripheral edge portion of the semiconductor IC bent to such an extent that the portion sank in the resin layer, and resultantly the resin of a lower portion of the semiconductor IC was pushed out laterally so as to relax pressure concentration due to the sinking.

Comparative Example 2

A mounted article was obtained in the same manner as in Comparative Example 1 except that a semiconductor IC pressed to an unhardened resin layer was left to stand in the atmosphere so as to absorb humidity in the resin layer, and then the resin layer was hardened using a drying machine on the same conditions.

<Evaluation 2>

Figure 37:
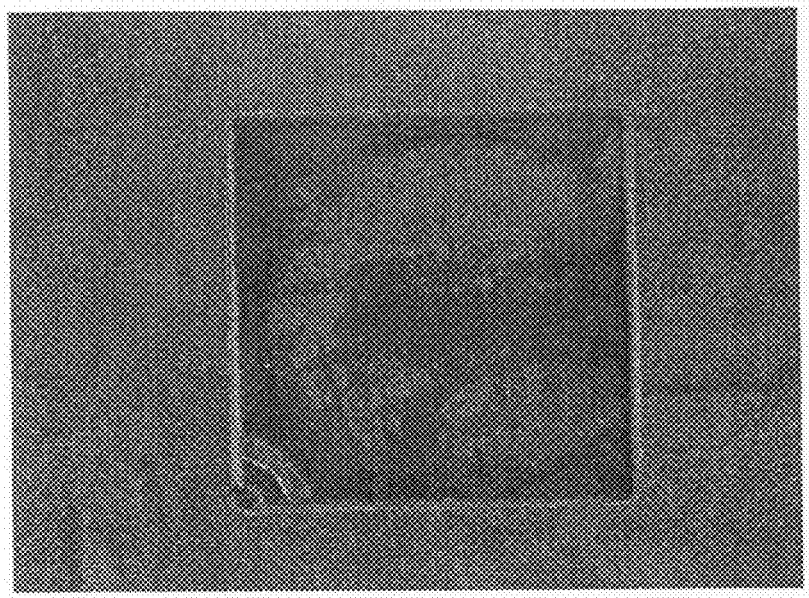
FIG. 37 is a planar microscope photograph of a resin layer after peeling a semiconductor IC in the mounted article of Example 1.
Figure 38:
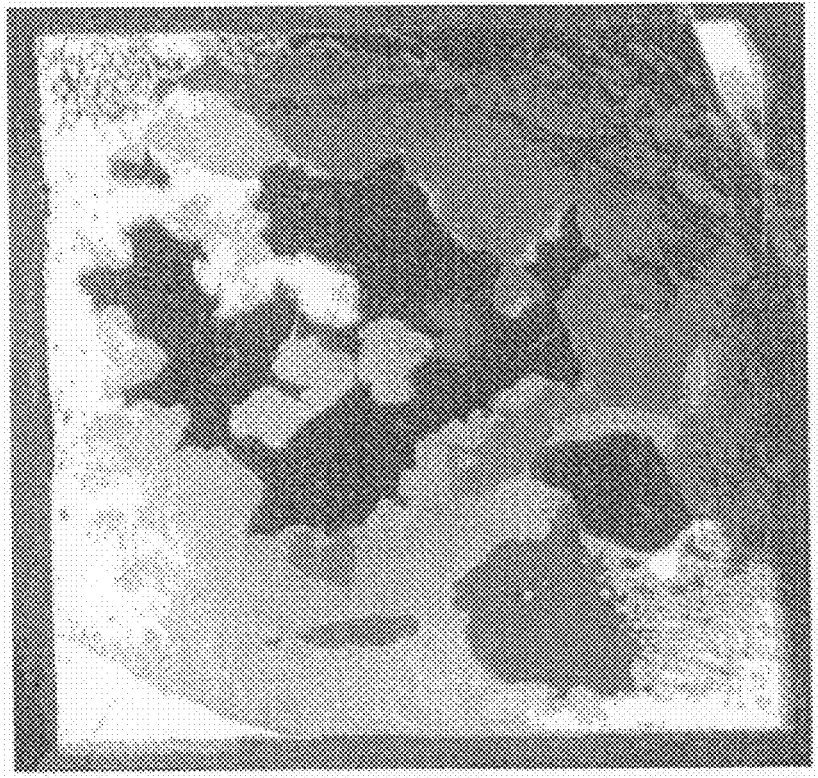
FIG. 38 is a planar microscope photograph of a resin layer after peeling a semiconductor IC in the mounted article of Comparative Example 1.

In the mounted articles obtained in the same manner as in Example 1 and the mounted article obtained in Comparative Example 2, the semiconductor IC was forcibly peeled from the resin layer, and a sectional state of the resin layer was obtained. FIGS. 37 and 38 are planar microscope photographs of the resin layers after peeling the semiconductor ICs in the mounted articles of Example 1 and Comparative Example 2, respectively. It has been confirmed from the photograph shown in FIG. 37 that in the mounted article of Example 1, any foam (void) was not present at the surface of the resin layer (a bonding interface between the semiconductor IC and the resin layer). On the other hand, a black portion of the photograph shown in FIG. 38 indicates that the surface of a base (a base material) under the resin layer is exposed, and it has been found from this photograph that remarkable foaming was generated in the surface of the resin layer (the bonding interface between the semiconductor IC and the resin layer) in the mounted article of Comparative Example 1. In consequence, it is understood that the mounted article of the example is remarkably excellent in peeling resistance as compared with the mounted article of the comparative example.

Example 2

Three mounted articles were obtained in the same manner as in Example 1 except that a thickness of an unhardened resin layer was set to 30 µm.

Example 3

A mounted article was obtained in the same manner as in Example 2 except that a semiconductor IC having a vertical size of 5 mm×a lateral size of 5 mm×a thickness of 60 µm was used.

Example 4

A mounted article was obtained in the same manner as in Example 2 except that a semiconductor IC having a vertical size of 2 mm×a lateral size of 3 mm×a thickness of 75 µm was used.

Comparative Example 2

A mounted article was obtained in the same manner as in Comparative Example 1 except that a thickness of an unhardened resin layer was set to 30 µm.

<Evaluation 3>

With regard to the mounted articles obtained in Examples 2 to 4 and Comparative Example 2, in the same manner as in Evaluation 2, images of sections at a plurality of portions of the semiconductor IC were picked with an electronic microscope, thicknesses of the resin layer at both end portions provided with bumps and in the center were measured, and a sunken amount and a sunken ratio of the peripheral end portion of the semiconductor IC in the resin layer with respect to the thickness of the resin layer at the center of the semiconductor IC were calculated. Results are integrally shown in Table 1.

In the table, a thickness of a hardened resin layer is an average value of measurement results at a plurality of portions of each mounted article. Both end portions are described as a "left end portion" and a "right end portion" for the sake of convenience. A sunken amount was obtained by subtracting a thickness of each of the left and right end portions from a thickness of the center of the hardened resin layer in the table. A sunken ratio is shown in a percentage obtained by dividing the sunken amount of each of the left and right end portions by the thickness of the center of the hardened resin layer. From these results, in the mounted articles of Examples 2 to 4 obtained by the mounting method of electronic components of the present invention, the sunken ratio of the peripheral end portion of the semiconductor IC was about 1% to 6% with respect to the center, and this was a very small sunken ratio below 10%, whereas in the mounted article of Comparative Example 2, the ratio had a significantly large value of about 30%.

TABLE 1

| | | Unhardened resin layer (thickness: μm) | Hardened resin layer (average thickness: μm) | | | Sunken amount (μm) of end portion of semiconductor IC | | Sunken ratio (%) of end portion of semiconductor IC | | Number of measurement portions |
|---|---|---|---|---|---|---|---|---|---|---|
| | Semiconductor IC (dimensions) | | Left end portion | Center | Right end portion | Left end portion | Right end portion | Left end portion | Right end portion | |
| Example 2 | 5 mm × 5 mm × 50 μm | 30 | 28.56 | 30.00 | 28.63 | 1.44 | 1.37 | 4.80 | 4.56 | 10 |
| | | | 28.95 | 30.24 | 28.28 | 1.43 | 1.96 | 4.73 | 6.47 | 10 |
| | | | 28.01 | 29.68 | 28.06 | 1.67 | 1.62 | 5.63 | 5.46 | 19 |
| Example 3 | 5 mm × 5 mm × 60 μm | 30 | 28.85 | 29.46 | 29.05 | 0.77 | 0.34 | 2.61 | 1.15 | 19 |
| Example 4 | 2 mm × 3 mm × 75 μm | 30 | 29.72 | 30.03 | 29.56 | 0.31 | 0.56 | 1.03 | 1.86 | 18 |
| Comparative Example 3 | 5 mm × 5 mm × 50 μm | 30 | 22.24 | 31.08 | 22.08 | 8.85 | 9.00 | 28.46 | 28.97 | 6 |

As described above, according to a mounting method of electronic components of the present invention, and a manufacturing method of an electronic component-embedded substrate by use of the mounting method, the electronic component-embedded substrate can be obtained in which when the electronic component and a resin layer are fixed, warp and bend of the electronic component can be inhibited, connection to a wiring layer can securely be retained, and deterioration of a securing strength of the electronic component can be inhibited. Therefore, the present invention can broadly and effectively be used in an apparatus in which the electronic component is embedded, a unit, a system, various devices and the like especially in a case where miniaturization and high performance are demanded.

What is claimed is:

1. A mounting method of electronic components in which electronic components are fixed and mounted on an insulating layer, comprising:
   a disposing step of disposing the electronic components on an unhardened resin which is to form the insulating layer;
   a pressurizing step of isotropically pressurizing the electronic components via a pressure medium; and
   a heating step of heating the resin to form the insulating layer,
   wherein the pressurizing step is performed at least while the resin softens in the heating step
   wherein the heating step first raises the temperature of the resin to around a melting point of the resin, and then further raises the temperature of the resin to at least a hardening start temperature of the resin, and maintains the temperature at least the hardening start temperature of the resin for a predetermined time.

2. The mounting method of the electronic components according to claim 1, wherein the pressurizing step isotropically pressurizes the electronic components and the resin in at least peripheries of the electronic components.

3. The mounting method of the electronic components according to claim 1, wherein the pressurizing step uses a gas or a liquid as the pressure medium.

4. The mounting method of the electronic components according to claim 1, wherein the pressurizing step uses, as the pressure medium, a film body or an elastic body which is arranged at least so as to cover bare surfaces of the electronic components and so as to come in close contact with the bare surfaces, and pressurizing means for applying a pressure to the film body or the elastic body.

5. The mounting method of the electronic components according to claim 1, wherein the pressurizing step is performed from a state, in which the temperature of the resin is lower than around the melting point of the resin, until another state, in which the temperature of the resin is higher than around the melting point of the resin and the resin hardens.

6. A manufacturing method of an electronic component-embedded substrate, comprising:
   a semiconductor fixing step of executing a disposing step of disposing electronic components on an unhardened resin which is to form an insulating layer;
   a pressurizing step of isotropically pressurizing the electronic components via a pressure medium and a heating step of heating the resin to form the insulating layer;
   an insulating layer forming step of forming a further insulating layer on the fixed electronic components; and
   a wiring layer forming step of forming a wiring layer to be electrically connected to the electronic components on the further insulating layer,
   wherein the pressurizing step is performed at least while the resin softens in the heating step
   wherein the heating step first raises the temperature of the resin to around a melting point of the resin, and then further raises the temperature of the resin to at least a hardening start temperature of the resin, and maintains the temperature at least the hardening start temperature of the resin for a predetermined time.

7. The manufacturing method of an electronic component-embedded substrate according to claim 6, wherein the pressurizing step is performed from a state, in which the temperature of the resin is lower than around the melting point of the resin, until another state, in which the temperature of the resin is higher than around the melting point of the resin and the resin hardens.

* * * * *